United States Patent
Song

(10) Patent No.: US 10,861,737 B2
(45) Date of Patent: Dec. 8, 2020

(54) METHOD AND APPARATUS FOR SEMICONDUCTOR DEVICE WITH REDUCED DEVICE FOOTPRINT

(71) Applicant: Vanguard International Semiconductor Corporation, Hsinchu (TW)

(72) Inventor: Chien-Hsien Song, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 161 days.

(21) Appl. No.: 15/956,977

(22) Filed: Apr. 19, 2018

(65) Prior Publication Data
US 2018/0247859 A1    Aug. 30, 2018

Related U.S. Application Data

(62) Division of application No. 14/242,269, filed on Apr. 1, 2014, now Pat. No. 9,978,635.

(51) Int. Cl.
| | |
|---|---|
| *H01L 21/762* | (2006.01) |
| *H01L 21/311* | (2006.01) |
| *H01L 29/417* | (2006.01) |
| *H01L 29/423* | (2006.01) |
| *H01L 29/66* | (2006.01) |
| *H01L 29/06* | (2006.01) |

(52) U.S. Cl.
CPC .. *H01L 21/76235* (2013.01); *H01L 21/31144* (2013.01); *H01L 29/0653* (2013.01); *H01L 29/41766* (2013.01); *H01L 29/42368* (2013.01); *H01L 29/66659* (2013.01)

(58) Field of Classification Search
CPC .................................................. H01L 27/0251
See application file for complete search history.

(56) References Cited

U.S. PATENT DOCUMENTS

| | | | |
|---|---|---|---|
| 6,521,944 B1 * | 2/2003 | Mirgorodski | ..... H01L 29/42336 257/317 |
| 6,891,220 B2 | 5/2005 | Yeh | |
| 2007/0278568 A1 | 12/2007 | Williams | |

* cited by examiner

*Primary Examiner* — Mohammad M Choudhry
(74) *Attorney, Agent, or Firm* — Finnegan, Henderson, Farabow, Garrett & Dunner, LLP

(57) ABSTRACT

A semiconductor device is provided. The semiconductor device includes a semiconductor layer, and a trench formed in a top surface of the semiconductor layer. The trench has a bottom surface and a sidewall. The semiconductor device further includes source and drain regions. One of the source and drain regions may be disposed at the bottom surface of the trench, and the other may be disposed at the top surface of the semiconductor layer, or vice versa. Alternatively, both source and drain regions may be disposed at the bottom surface of the trench. The semiconductor device may further include a first insulator disposed in the trench and in between the source and drain regions. The semiconductor device may further include a second insulator disposed between first insulator and the source region. The semiconductor device may further include a conductive member that disposed on the first insulator, or on the first and second insulators.

15 Claims, 18 Drawing Sheets

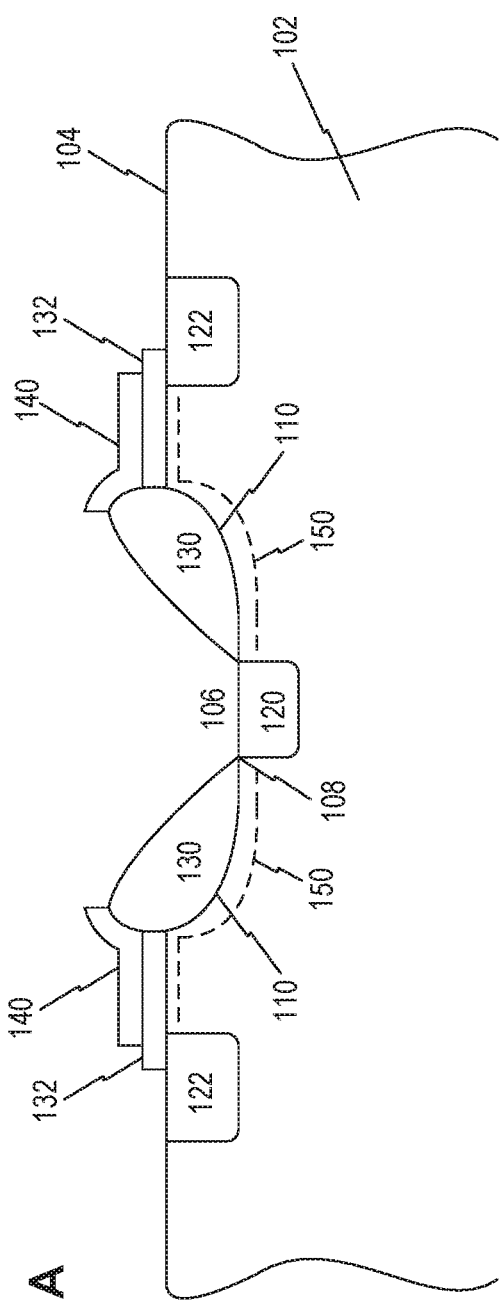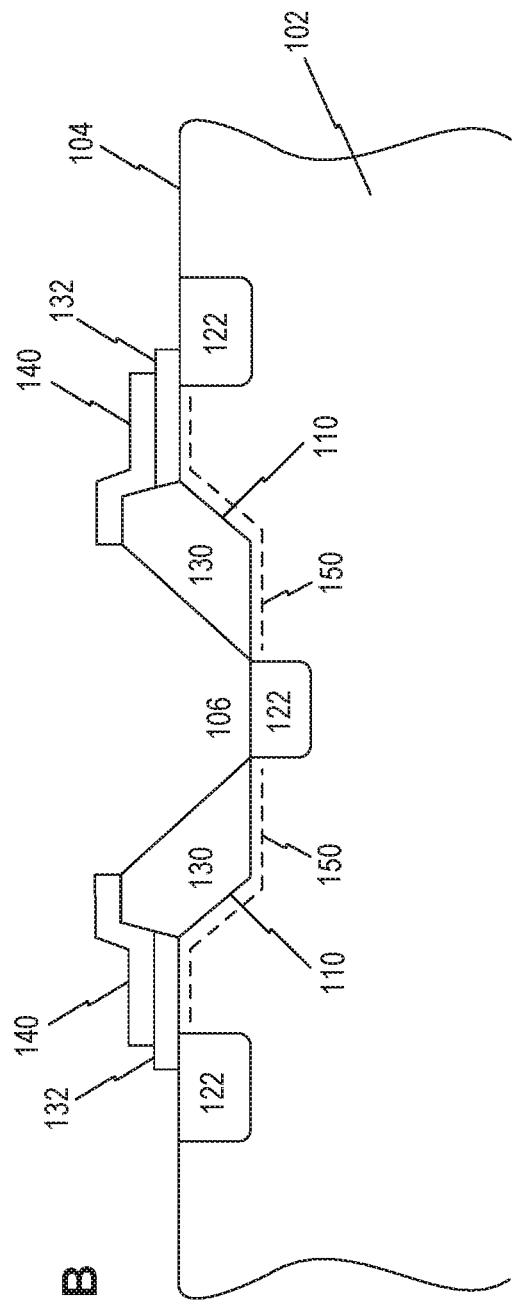

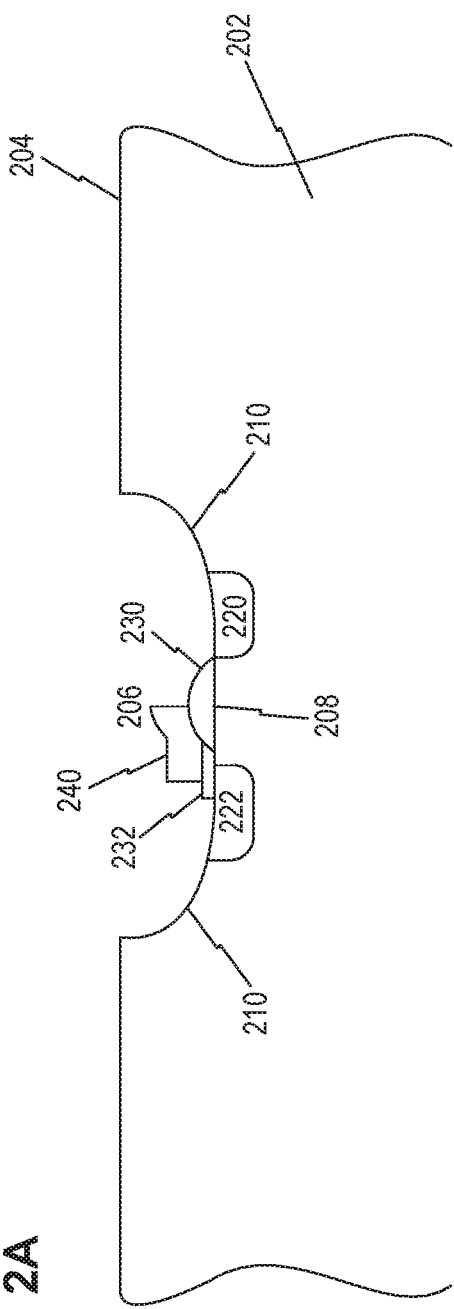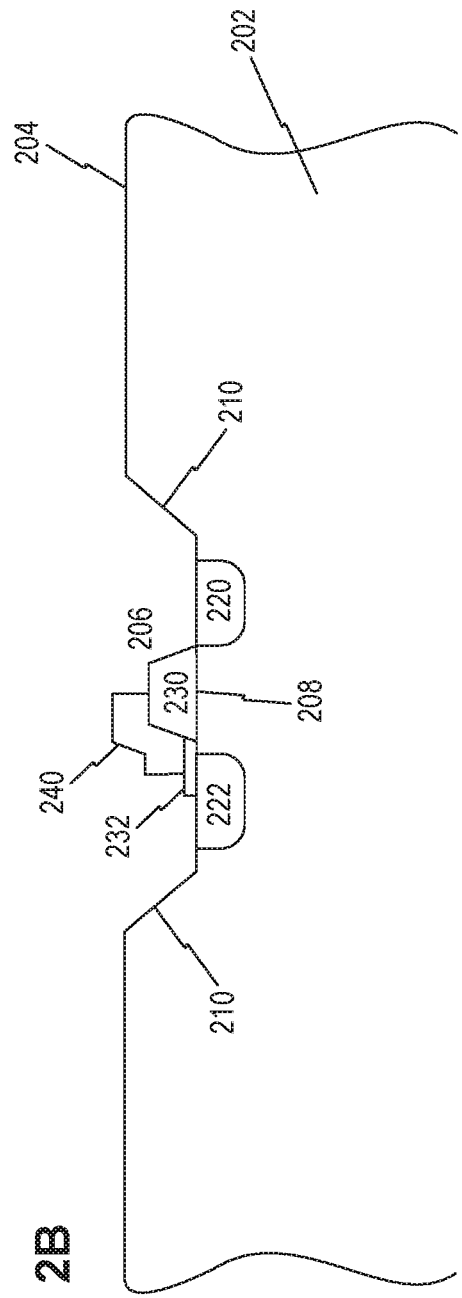

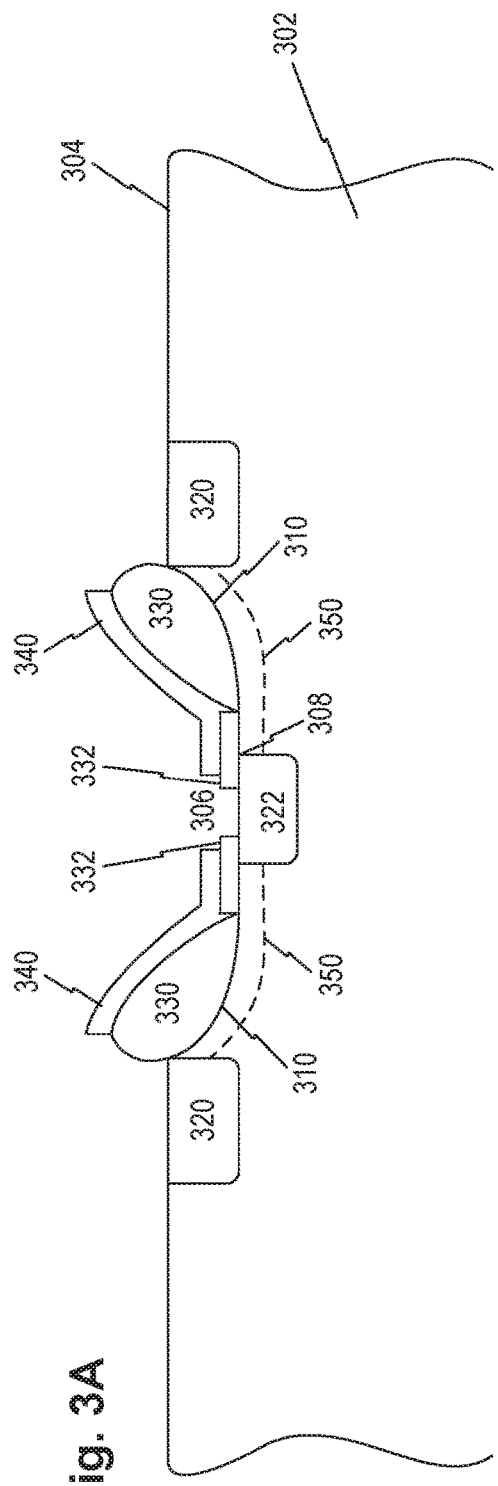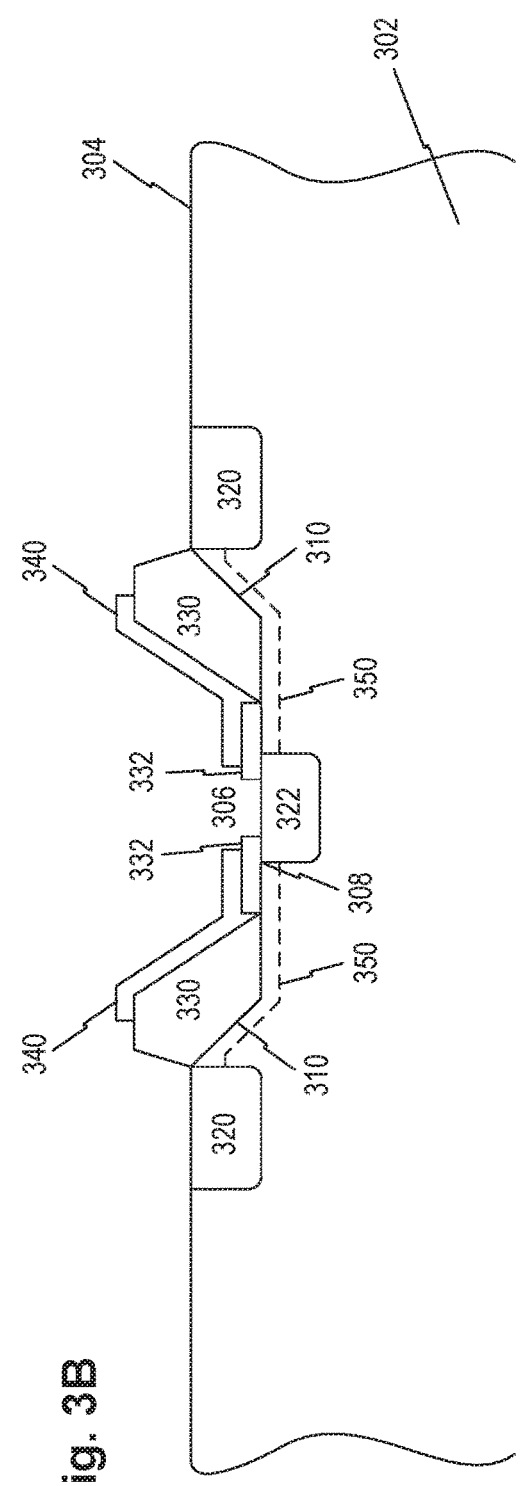

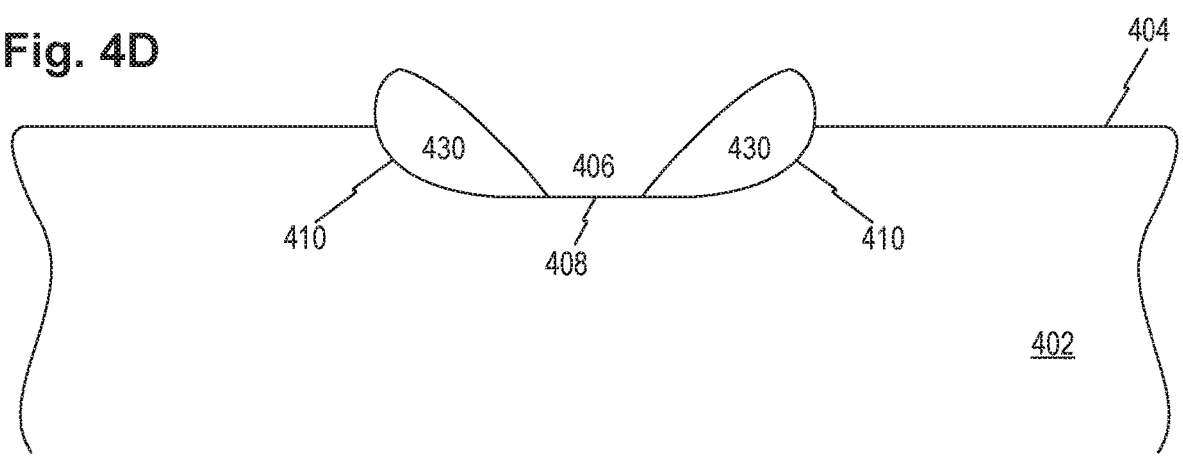
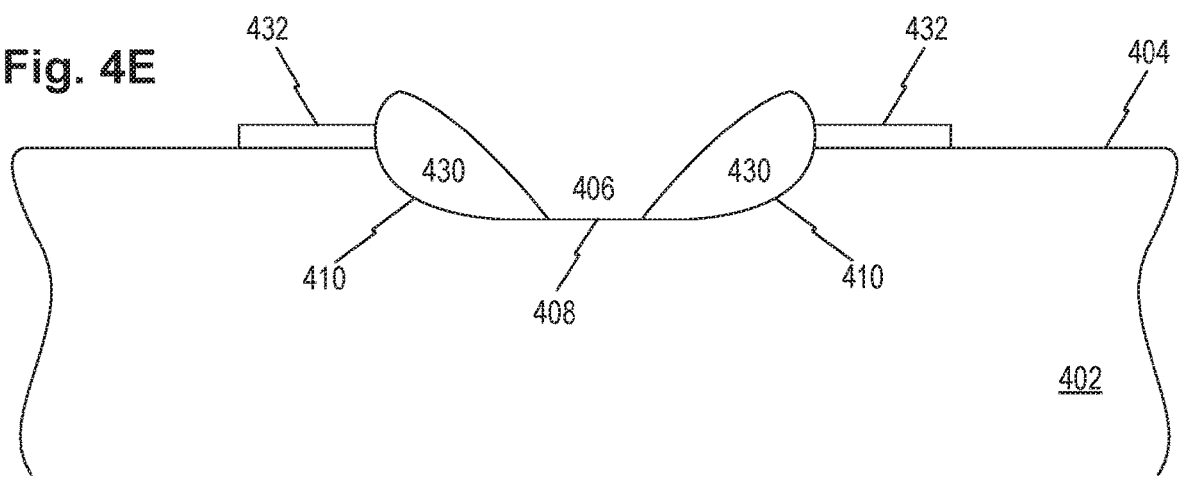
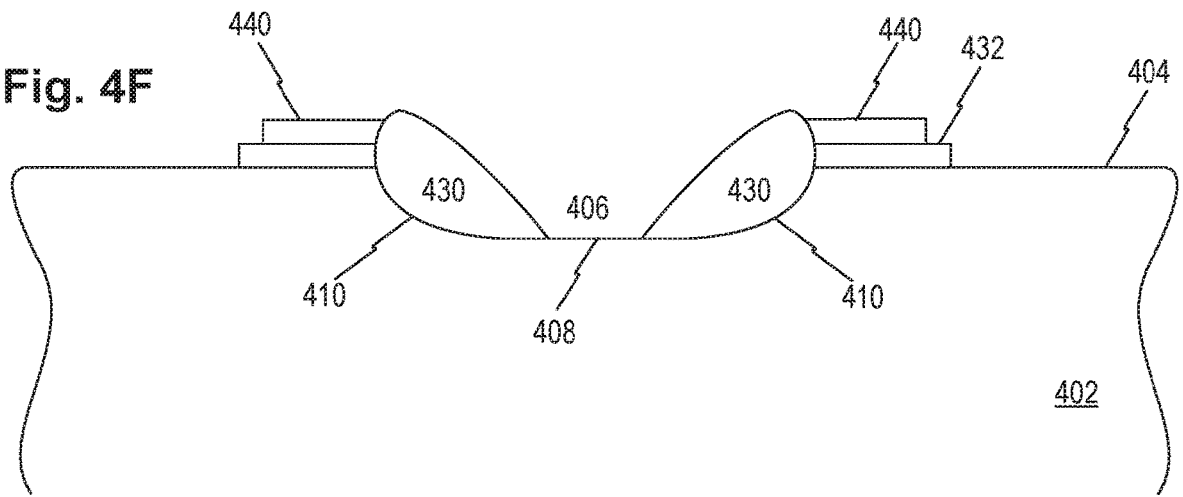

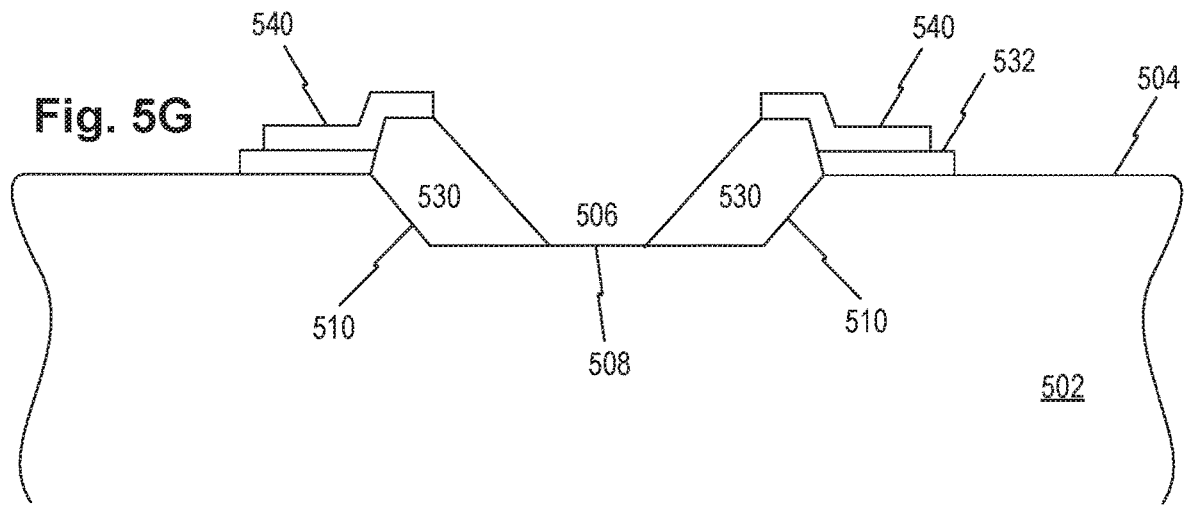
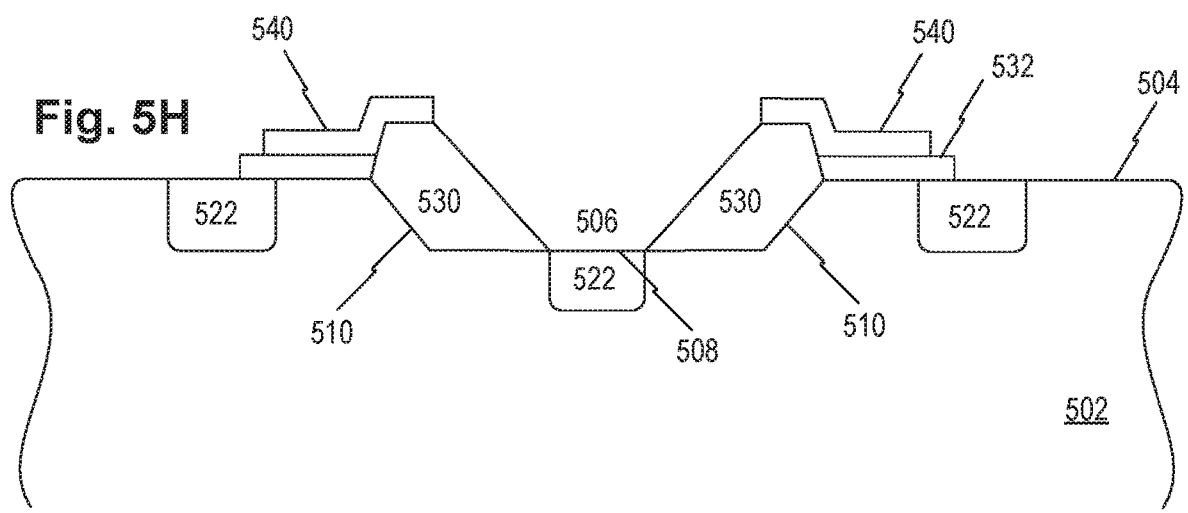

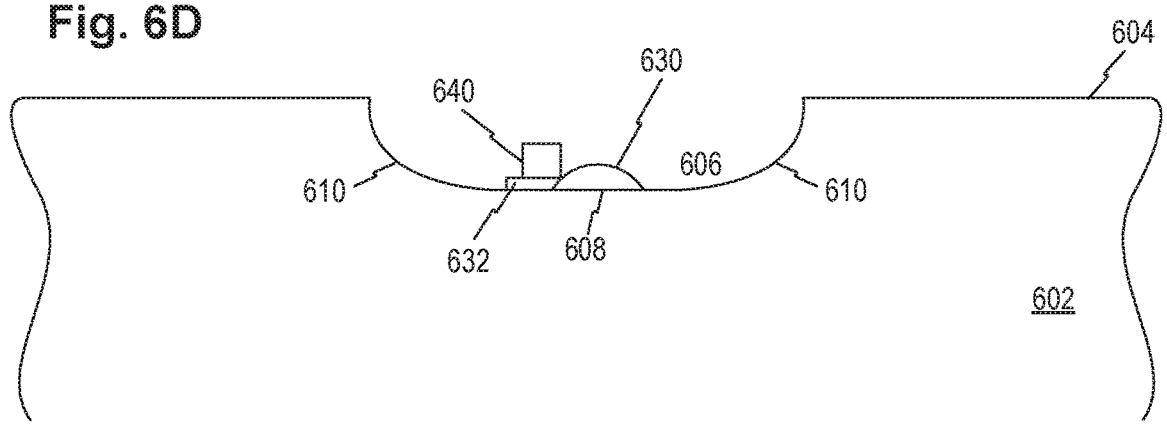
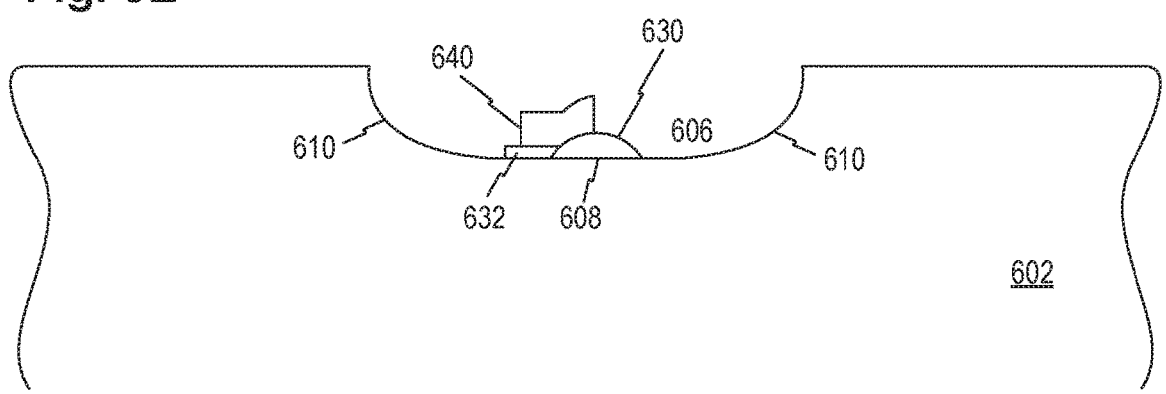
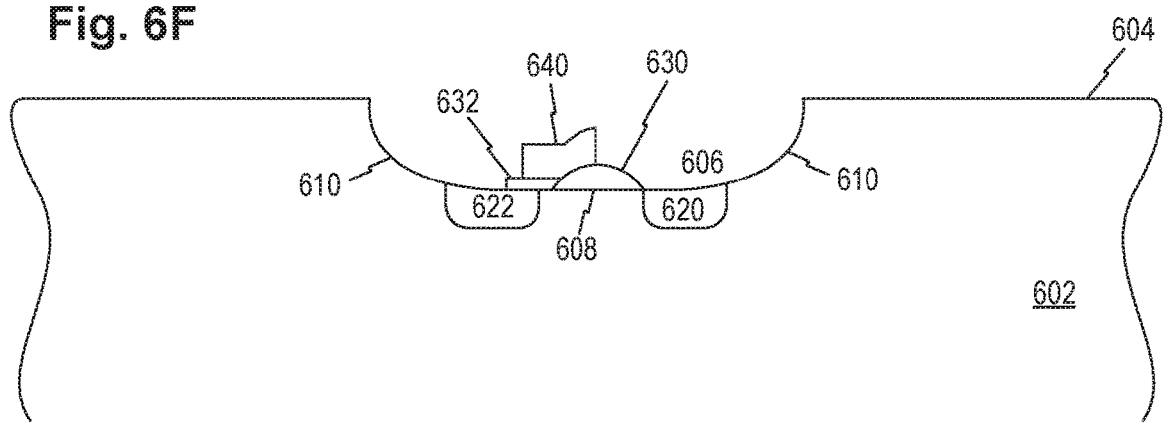

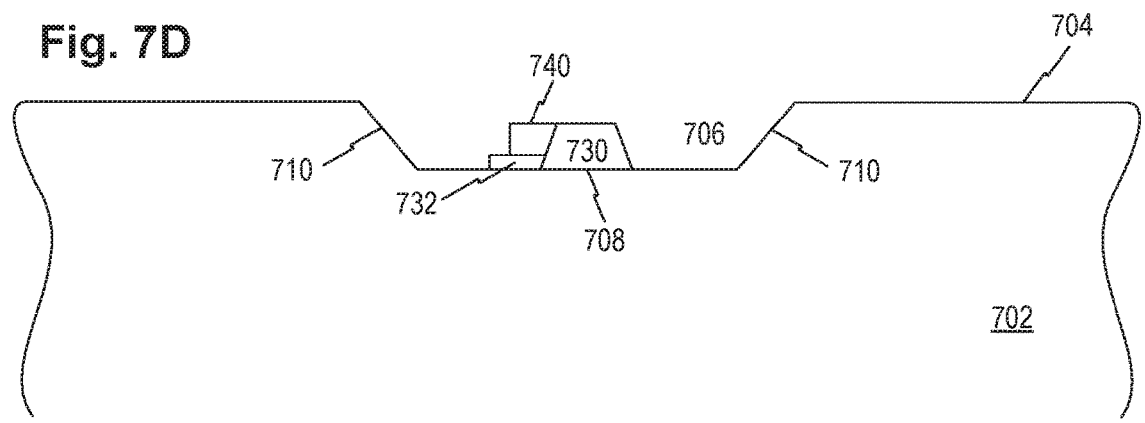
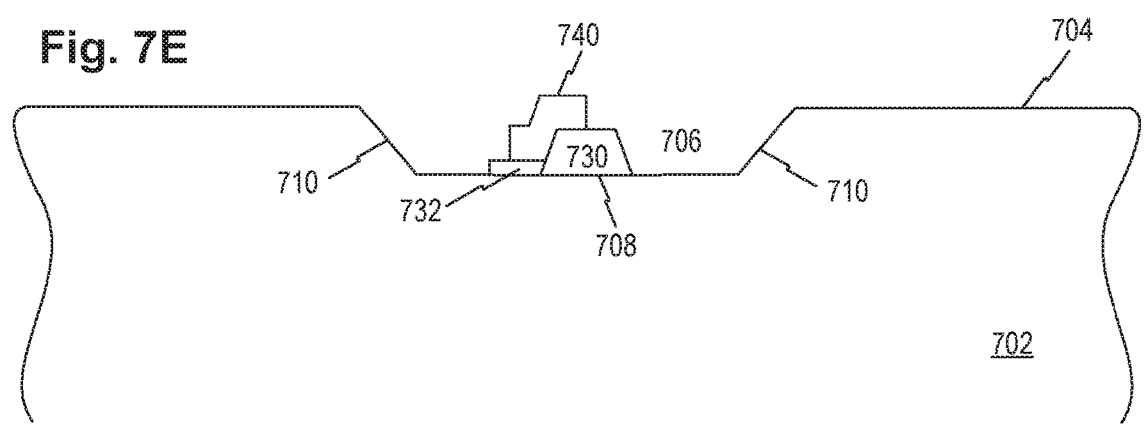
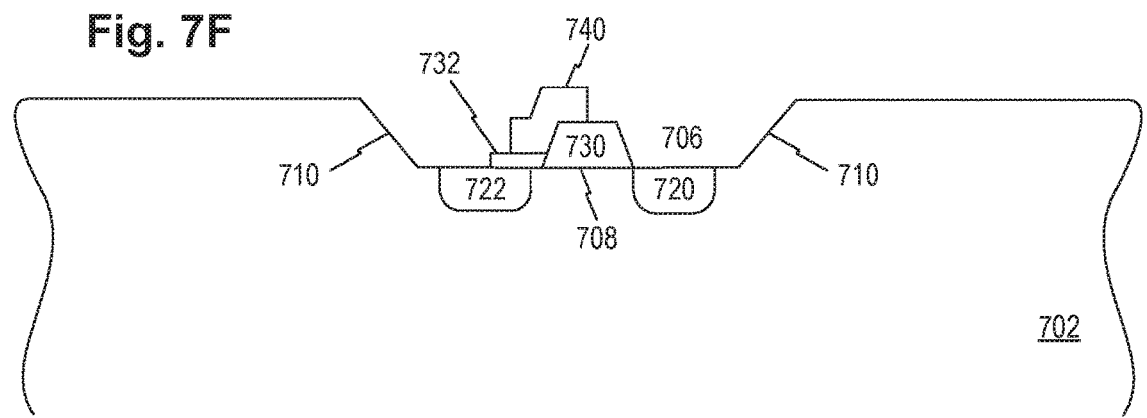

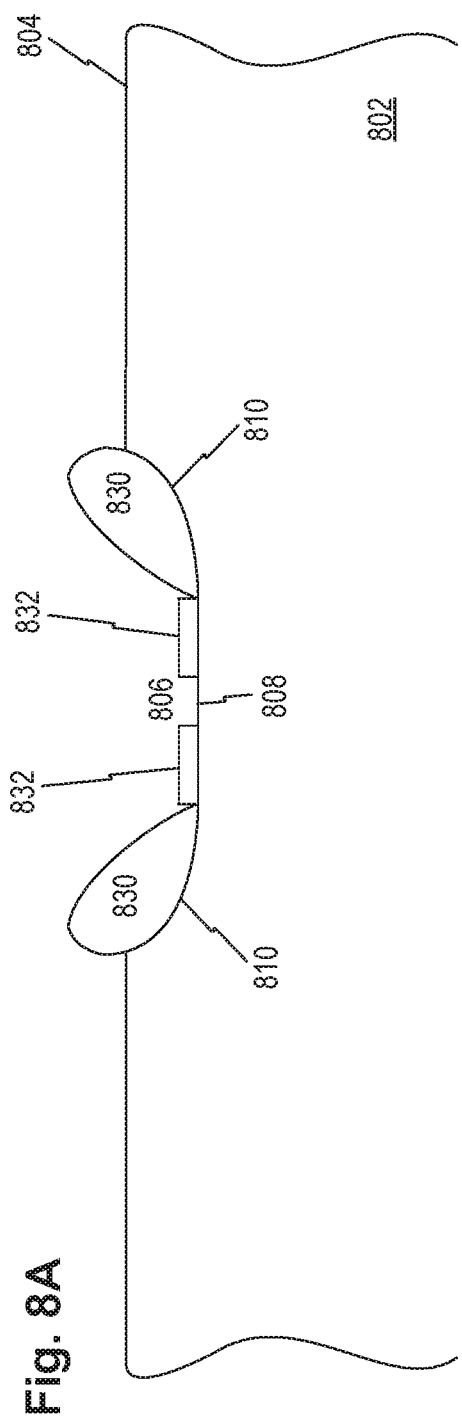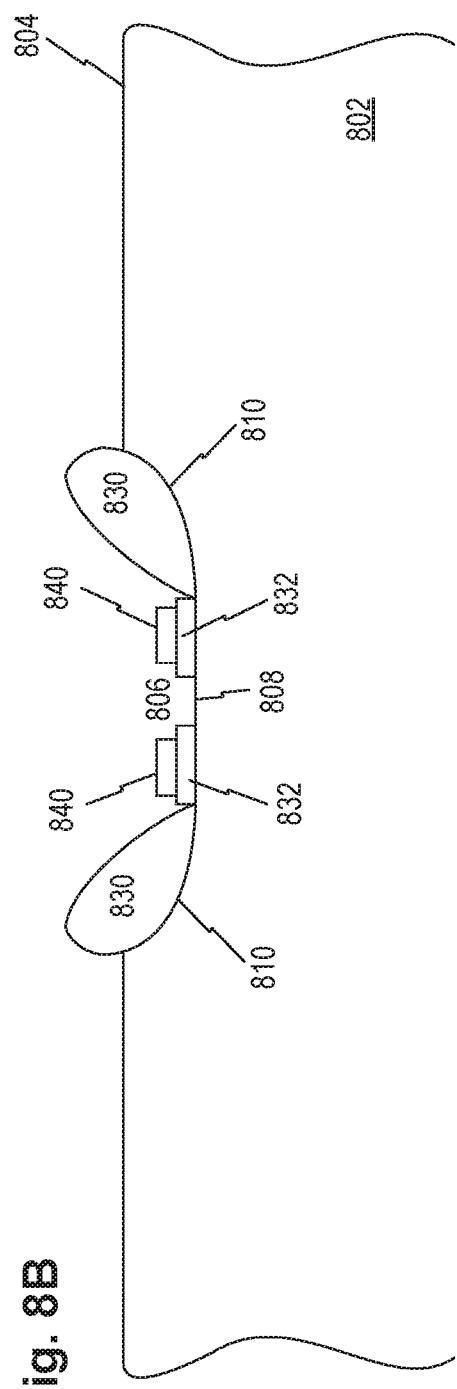

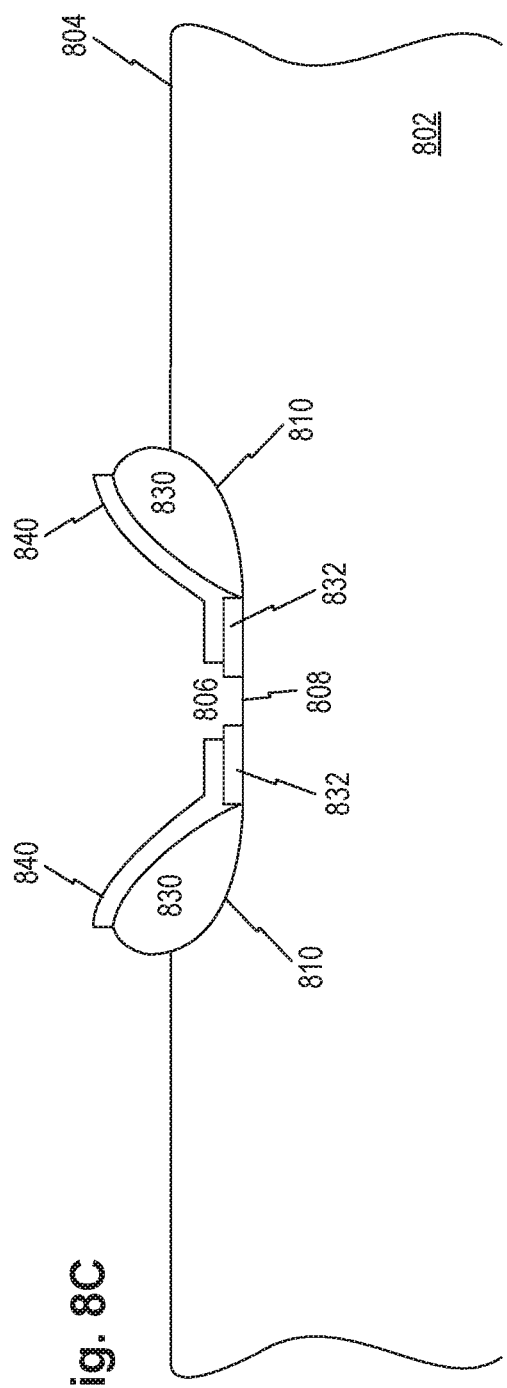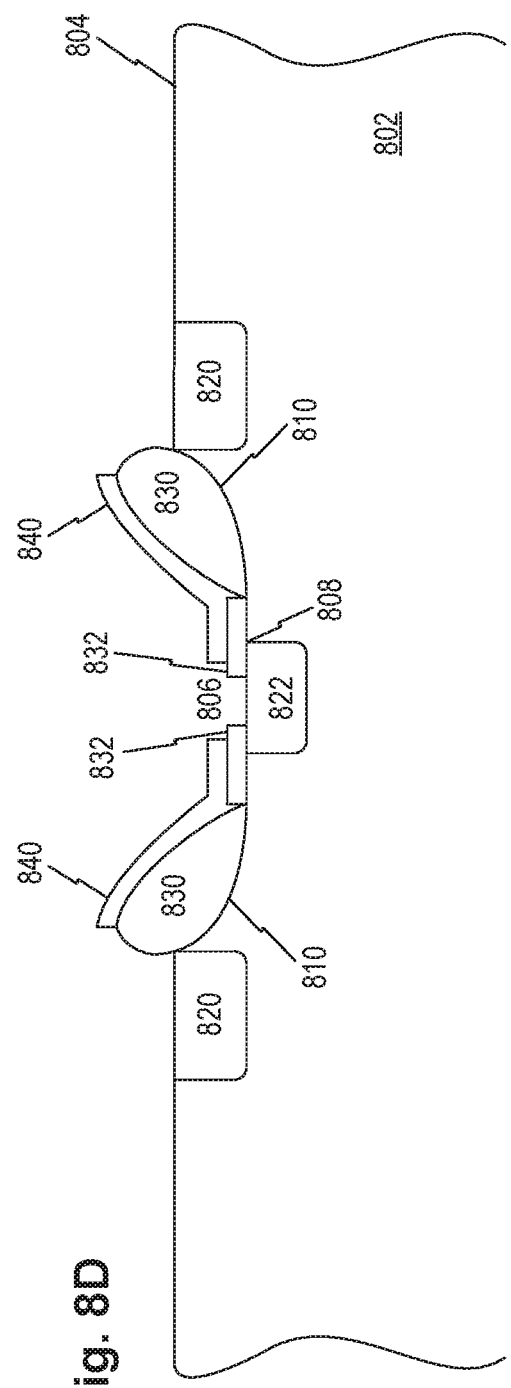

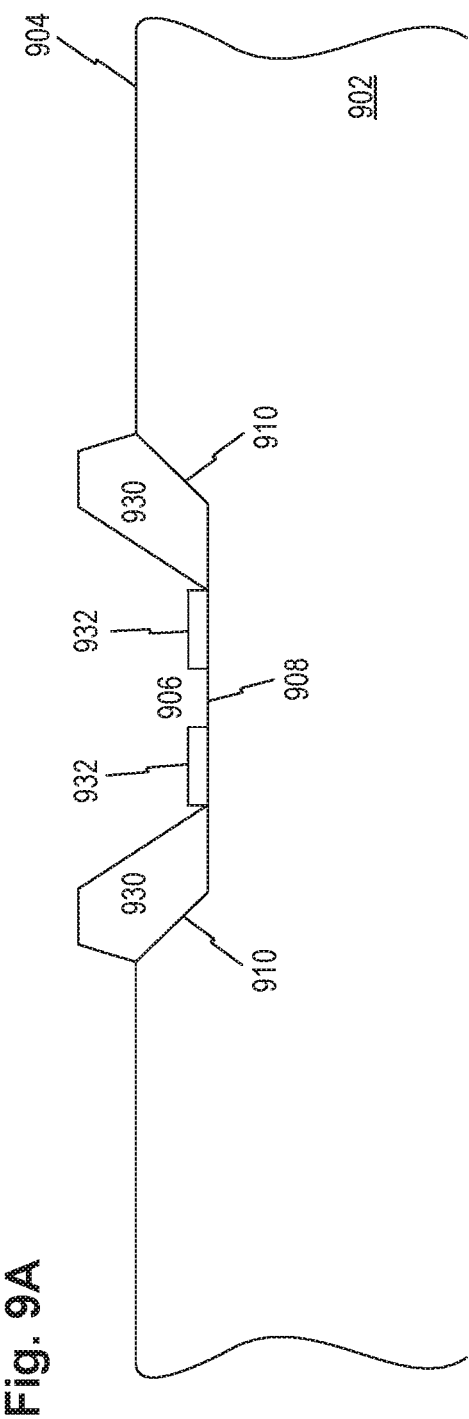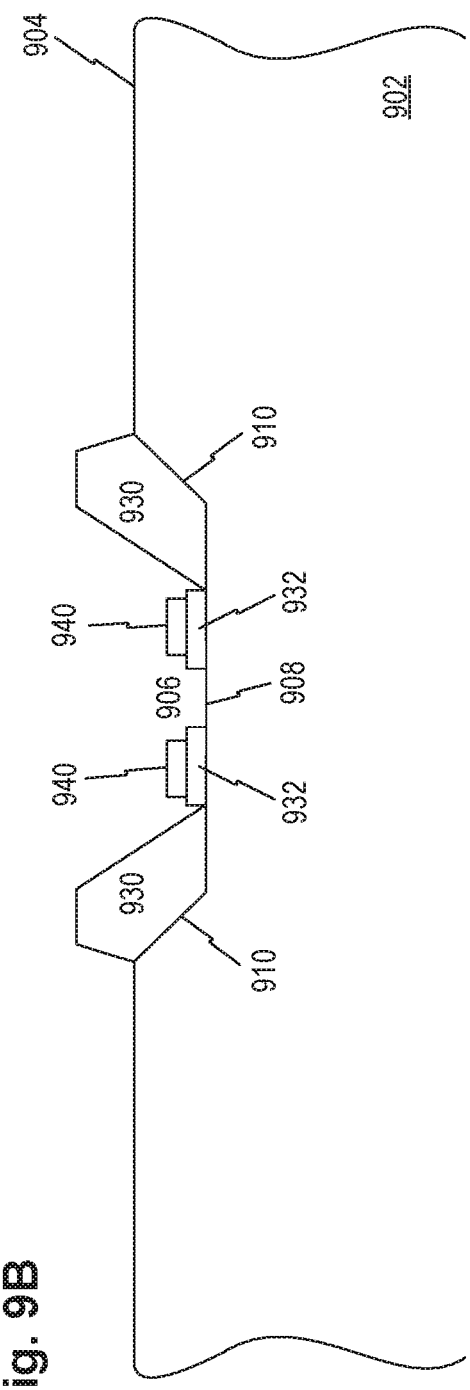

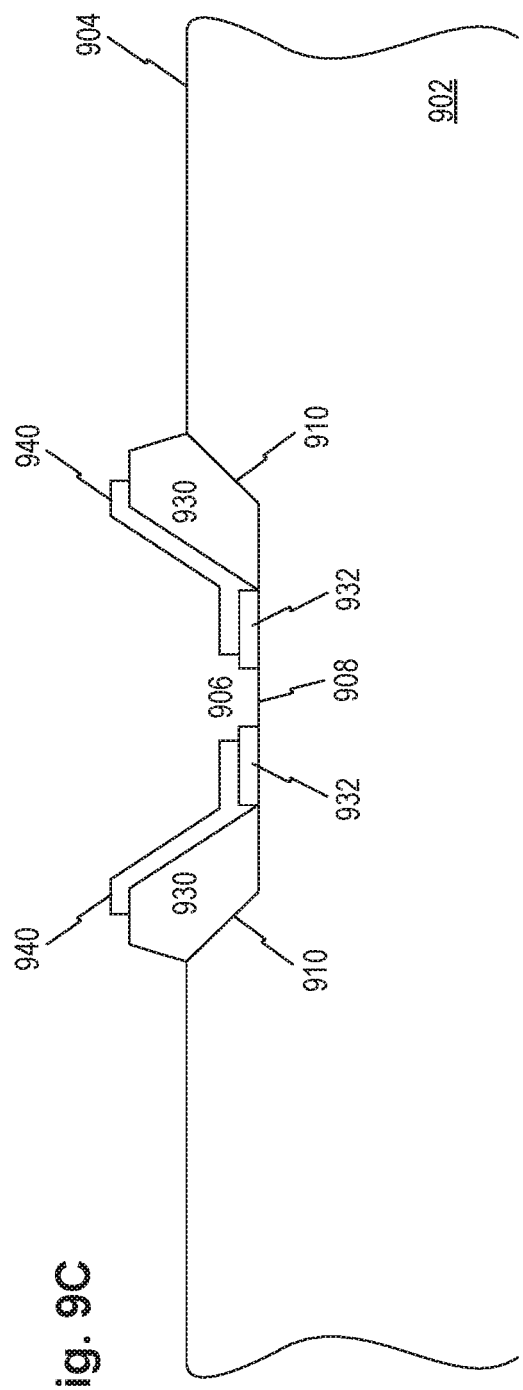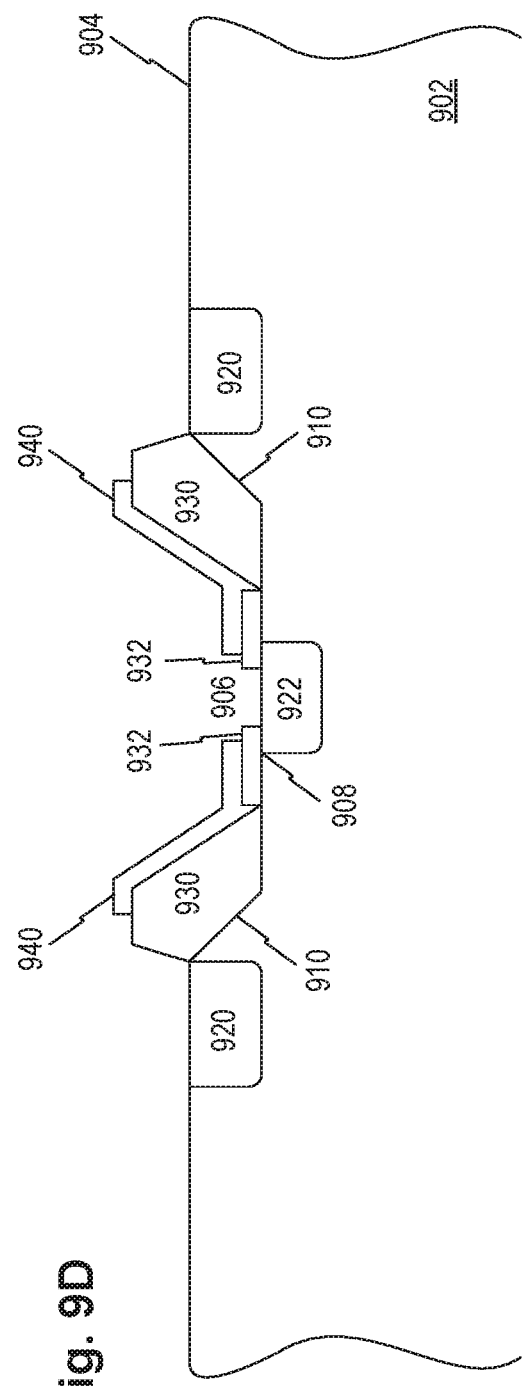

US 10,861,737 B2

METHOD AND APPARATUS FOR SEMICONDUCTOR DEVICE WITH REDUCED DEVICE FOOTPRINT

This is a Divisional of application Ser. No. 14/242,269, filed Apr. 1, 2014, which is incorporated herein by reference.

Example embodiments relate to a semiconductor device, and in particular, to a semiconductor device with reduced device footprint and a method for manufacturing the same.

BACKGROUND

Breakdown voltage is an important parameter for many semiconductor devices because it often determines limits of a semiconductor device's operation voltage range. In order to increase breakdown voltage of a semiconductor device, several methods are commonly in use, for example: reducing doping concentration of a region between two electrical terminals (e.g., between source and drain, anode and cathode, or gate and drain . . . etc.) or increasing the distance of between the two terminals.

When designing a semiconductor device, certain parameters are often fixed in order to achieve a certain performance goal, while some other parameters may be adjusted to further enhance the overall device performance. For example, in order to achieve a certain threshold voltage for a metal oxide semiconductor field effect transistor (MOSFET), doping concentration of a channel region, which is between source and drain regions ("the two terminals"), is fixed. Breakdown voltage between the two terminals can be increased by increasing the distance between the two terminals (for example by adding a drain extension region between the drain region and the channel region) without substantially affecting the threshold voltage.

However, an increase of the distance between the two terminals increases device footprint, which may reduce the number of devices which can be manufactured per unit area on a wafer and may thus increase manufacture costs.

Thus, there exists a need in the art for developing a semiconductor device, capable of scaling the distance between two terminals to improve device performance (for example, a greater breakdown voltage) without substantially increasing the device footprint.

SUMMARY

In accordance with some embodiments of this disclosure, a semiconductor device may include a semiconductor layer and a first trench formed in a first top surface of the semiconductor layer, the first trench having a first bottom surface and a first sidewall. The semiconductor device may also include a first drain region disposed at the first bottom surface of the first trench, and a first source region disposed at the first top surface of the semiconductor layer and spaced apart from the first drain region. Further, the semiconductor device may include a first insulator disposed in the trench, between the first drain region and the first source region, and in contact with the first bottom surface and the first sidewall of the first trench. In addition, the semiconductor device may include a second insulator disposed between the first drain region and the first source region, and on the first top surface of the semiconductor layer.

In various embodiments, the semiconductor device may include one or more of the following features: the first sidewall of the first trench being curved; an angle formed between the first sidewall and the first bottom surface of the first trench being greater than 90 degrees; a first conductive member disposed on the second insulator; and a first conductive member disposed on the first insulator and the second insulator.

In some embodiments, the semiconductor device may further include a second trench formed in a second top surface of the semiconductor layer, the second trench having a second bottom surface, and a second sidewall; a second drain region disposed at the second bottom surface of the second trench; a second source region disposed at the second bottom surface of the second trench; a third insulator disposed in the second trench, between the second drain region and the second source region, and on the second bottom surface of the second trench; and a fourth insulator disposed in the second trench, between the second source region and the third insulator, and on the second bottom surface of the second trench.

In various embodiments, the semiconductor device may further include one or more of the following features: the second sidewall of the second trench being curved; a second angle formed between the second sidewall and the second bottom surface of the second trench being greater than 90 degrees; a second conductive member disposed on the fourth insulator; a second conductive member disposed on the third insulator and the fourth insulator; the first insulator and the third insulator being formed of the same material; and the first insulator and the third insulator having different thicknesses.

Alternatively, in some embodiments, the semiconductor device may further include a second trench formed in a second top surface of the semiconductor layer, the second trench having a second bottom surface and a second sidewall. The semiconductor device may also include a second drain region disposed at the second top surface of the semiconductor layer, and a second source region disposed at the second bottom surface of the second trench. Further, the semiconductor device may include a third insulator disposed in the second trench, between the second drain region and the second source region, and in contact with the second bottom surface and the second sidewall of the second trench. In addition, the semiconductor device may include a fourth insulator disposed in the second trench, between the second source region and the third insulator, and on the second bottom surface of the second trench.

In various embodiments, the semiconductor device may include one or more of the following features: the second sidewall of the second trench being curved; a second angle formed between the second sidewall and the second bottom surface of the second trench being greater than 90 degrees; a second conductive member disposed on the fourth insulator; a second conductive member disposed on the third insulator and the fourth insulator; the first insulator and the third insulator being formed of the same material; and the first insulator and the third insulator having different thicknesses.

In accordance with some embodiments of this disclosure, a semiconductor device may include a semiconductor layer, and a first trench formed in a first top surface of the semiconductor layer, the first trench having a first bottom surface and a first sidewall. The semiconductor device may also include a first source region disposed at the first bottom surface of the first trench, and a first drain region disposed at the first top surface of the semiconductor layer and spaced apart from the first source region. Further, the semiconductor device may include a first insulator disposed in the first trench, between the first source region and the first drain region, and in contact with the first bottom surface and the first sidewall of the first trench. In addition, the semiconductor device may include a second insulator disposed between the first source region and the first insulator, and on the first bottom surface of the first trench.

In various embodiments, the semiconductor device may include one or more of the following features: the first sidewall of the first trench being curved; an angle formed between the first sidewall and the first bottom surface of the first trench being greater than 90 degrees; a first conductive member disposed on the second insulator; and a first conductive member disposed on the first insulator and the second insulator.

In some embodiments, the semiconductor device may further include a second trench formed in a second top surface of the semiconductor layer, the second trench having a second bottom surface, and a second sidewall. The semiconductor device may also include a second drain region disposed at the second bottom surface of the second trench, and a second source region disposed at the second bottom surface of the second trench. Further, the semiconductor device may include a third insulator disposed in the second trench, between the second drain region and the second source region, and on the second bottom surface of the second trench. In addition, the semiconductor device may include a fourth insulator disposed in the second trench, between the second source region and the third insulator, and on the second bottom surface of the second trench.

In various embodiments, the semiconductor device may include one or more of the following features: the second sidewall of the second trench being curved; an angle formed between the second sidewall and the second bottom surface of the second trench being greater than 90 degrees; a second conductive member disposed on the fourth insulator; a second conductive member disposed on the third insulator and the fourth insulator; the first and the third insulator being formed of the same material; and the first insulator and the third insulator having different thicknesses.

Alternatively, in some embodiments, the semiconductor device may further include a second trench formed in a second top surface of the semiconductor layer, the second trench having a second bottom surface and a second sidewall. The semiconductor device may also include a second drain region disposed at the second top surface of the semiconductor layer, and a second source region disposed at the second bottom surface of the second trench. Further, the semiconductor device may include a third insulator disposed in the second trench between the second drain region and the second source region, and in contact with the second bottom surface and the second sidewall of the second trench. In addition, the semiconductor device may include a fourth insulator disposed between the second source region and the third insulator, and on the second bottom surface of the second trench.

In various embodiments, the semiconductor device may include one or more of the following features: the second sidewall of the second trench being curved; an angle formed between the second sidewall and the second bottom surface of the second trench being greater than 90 degrees; a second conductive member disposed on the fourth insulator; a second conductive member disposed on the third insulator and the fourth insulator; the first insulator and the third insulator being formed of the same material; and the first insulator and the third insulator having different thicknesses.

In accordance with some embodiments of this disclosure, a semiconductor device may include a semiconductor layer, and a trench formed in a top surface of the semiconductor layer, the trench having a bottom surface and a sidewall. The semiconductor device may also include a drain region disposed at the bottom surface of the trench, and a source region disposed at the bottom surface of the trench. Further, the semiconductor device may include a first insulator disposed in the trench, between the drain region and the source region, and on the bottom surface of the trench. In addition, the semiconductor device may include a second insulator disposed in the trench, between the first insulator and the source region, and on the bottom surface of the trench.

In various embodiments, the semiconductor device may include one or more of the following features: the sidewall of the trench being curved; an angle formed between the sidewall and the bottom surface of the trench being greater than 90 degrees; a conductive member disposed on the second insulator; and a conductive member disposed on the first insulator and the second insulator.

In accordance with some embodiments of this disclosure, a semiconductor device may include a semiconductor layer, and first and second doped regions disposed on the semiconductor layer. The semiconductor device may also include an insulator disposed between the first doped region and the second doped region so as to define, when the semiconductor device is activated, a current conduction path in the semiconductor layer between the first doped region and the second doped region, the current conduction path being disposed substantially along a perimeter of the insulator and having a vertical component and a horizontal component.

In accordance with some embodiments of this disclosure, a method of forming a semiconductor structure may include forming a first insulator layer on a first top surface of a semiconductor layer, the first insulator layer extending below the first top surface and being in contact with a first trench in the first top surface, the first trench having a first bottom surface and a first sidewall, the first bottom surface and the first sidewall being in contact with the first insulator layer. The method may also include forming a first hard mask on the first insulator layer. Further, the method may include forming a first opening through the first hard mask and the first insulator layer, the first opening extending to the first bottom surface of the first trench. Still further, the method may include removing the first hard mask and a portion of the first insulator layer such that a remaining portion of the first insulator layer is in contact with the first bottom surface and the first sidewall. In addition, the method may include forming a second insulator layer on the first top surface of the semiconductor layer, the second insulator layer being adjacent to the first insulator layer. Additionally, the method may include forming a first drain region at the first bottom surface of the first trench; and forming a first source region at the first top surface of the semiconductor layer, the first source region being adjacent to the second insulator layer, and separated from the first drain region by the first and second insulator layers.

In various embodiments, the method may include one or more of the following features: forming a first conductive member on the second insulator layer; forming a first conductive member on the first and second insulator layers; forming the first insulator layer with a LOCOS process; forming the first insulator layer with a shallow trench isolation process; and removing the first hard mask and the portion of the first insulator layer further including removing a first region at a higher rate than removing a second region, wherein the first region is adjacent to the hard mask and second region is spaced apart from the hard mask.

In some embodiments, the method may further include forming a third insulator layer on a second top surface of the semiconductor layer, the third insulator layer extending below the second top surface and being in contact with a second trench in the second top surface, the second trench having a second bottom surface and a second sidewall. The method may also include forming a second hard mask on the third insulator layer; and forming a second opening and a third opening through the second hard mask and the third insulator layer, the second and third openings extending to the second bottom surface and the second sidewall of the second trench. Further, the method may include removing the second hard mask and a portion of the third insulator layer such that a remaining portion of the third insulator layer is in contact with the second bottom surface of the second trench. Still further, the method may include forming a fourth insulator layer on the second bottom surface of the second trench, the fourth insulator layer being adjacent to the third insulator layer. In addition, the method may include forming a second drain region at the second bottom surface of the second trench. Additionally, the method may include forming a second source region at the second bottom surface of the second trench, the second source region being adjacent to the fourth insulator layer, and laterally separated from the second drain region by the third and fourth insulator layers.

In various embodiments, the method may include one or more of the following features: forming a second conductive member on the fourth insulator layer; forming a second conductive member on the third and fourth insulator layers; forming the first insulator layer and the third insulator layer in a single process step; forming the third insulator layer with a LOCOS process; forming the third insulator layer with a shallow trench isolation process; and removing the first hard mask and the portion of the first insulator layer further including removing a first region at a higher rate than removing a second region, wherein the first region is adjacent to the hard mask and second region is spaced apart from the hard mask.

Alternatively, in some embodiments, the method may further include forming a third insulator layer on a second top surface of the semiconductor layer, the third insulator layer extending below the second top surface and being in contact with a second trench in the second top surface, the second trench having a second bottom surface and a second sidewall. The method may also include forming a second hard mask on the third insulator layer; and forming a second opening through the second hard mask and the third insulator layer, the second opening extending to the second bottom surface of the second trench. Further, the method may include removing the second hard mask and a portion of the third insulator layer such that a remaining portion of the third insulator layer is in contact with the second bottom surface and the second sidewall. Still further, the method may include forming a fourth insulator layer on the second bottom surface of the second trench, the fourth insulator layer being adjacent to the third insulator layer. In addition, the method may include forming a second drain region at the second top surface of the semiconductor layer. Additionally, the method may include forming a second source region at the second bottom surface of the second trench, the second source region being adjacent to the fourth insulator layer, and separated from the second drain region by the third and fourth insulator layers.

In various embodiments, the method may include one or more of the following features: forming a second conductive member on the fourth insulator layer; forming a second conductive member on the third and fourth insulator layers; forming the first insulator layer and the third insulator layer in a single process step; forming the third insulator layer with a LOCOS process; and forming the third insulator layer with a shallow trench isolation process.

In accordance with some embodiments of this disclosure, a method of forming a semiconductor structure may include forming a first insulator layer on a first top surface of a semiconductor layer, the first insulator layer extending below the first top surface and being in contact with a first trench in the first top surface, the first trench having a first bottom surface and a first sidewall, the first bottom surface and the first sidewall being in contact with the first insulator layer. The method may also include forming a first hard mask on the first insulator layer; and forming a first opening through the first hard mask and the first insulator layer, the first opening extending to the first bottom surface of the first trench. Further, the method may include removing the first hard mask and a portion of the first insulator layer such that a remaining portion of the first insulator layer is in contact with the first bottom surface and the first sidewall. Still further, the method may include forming a second insulator layer on the first bottom surface of the first trench, the second insulator layer being adjacent to the first insulator layer. In addition, the method may include forming a first drain region at the first top surface of the semiconductor layer. Additionally, the method may include forming a first source region at the first bottom surface of the trench, the first source region being adjacent to the second insulator layer.

In various embodiments, the method may include one or more of the following features: forming a first conductive member on the second insulator layer; forming a first conductive member on the first and second insulator layers; forming the first insulator layer comprises forming the first insulator layer with a LOCOS process; forming the first insulator layer including forming the first insulator layer with a shallow trench isolation process; and removing the first hard mask and the portion of the first insulator layer further including removing a first region at a higher rate than removing a second region, wherein the first region is adjacent to the hard mask and second region is spaced apart from the hard mask.

In some embodiments, the method may further include forming a third insulator layer on a second top surface of the semiconductor layer, the third insulator layer extending below the second top surface and being in contact with a second trench in the second top surface, the second trench having a second bottom surface and a second sidewall. The method may also include forming a second hard mask on the third insulator layer; and forming a second opening and a third opening through the second hard mask and the third insulator layer, the second and third openings extending to the second bottom surface and the second sidewall of the second trench. Further the method may include removing the second hard mask and a portion of the third insulator layer such that a remaining portion of the third insulator layer is in contact with the second bottom surface of the second trench. Still further, the method may include forming a fourth insulator layer on the second bottom surface of the second trench, the fourth insulator layer being adjacent to the third insulator layer. In addition, the method may include forming a second drain region at the second bottom surface of the second trench. Additionally, the method may include forming a second source region at the second bottom surface of the second trench, the second source region being adjacent to the fourth insulator layer, and separated from the second drain region by the third and fourth insulator layers.

In various embodiments, the method may include one or more of the following features: forming a second conductive member on the fourth insulator layer; forming a second conductive member on the third and fourth insulator layers; forming the first insulator layer and the third insulator layer a single process step; forming the third insulator layer, including forming the third insulator layer with a LOCOS process; and forming the third insulator layer including forming the third insulator layer with a shallow trench isolation process.

In accordance with some embodiments of this disclosure, a method of forming a semiconductor structure may include forming a first insulator layer on a top surface of the semiconductor layer, the first insulator layer extending below the top surface and being in contact with a trench in the top surface, the trench having a bottom surface and a sidewall. The method may also include forming a hard mask on the first insulator layer; and forming a first opening and a second opening through the hard mask and the first insulator layer, the first and second openings extending to the bottom surface and the sidewall of the trench. Further, the method may include removing the hard mask and a portion of the first insulator layer such that a remaining portion of the first insulator layer is in contact with the bottom surface of the trench. Still further, the method may include forming a second insulator layer on the bottom surface of the trench, the second insulator layer being adjacent to the first insulator layer. In addition, the method may include forming a drain region at the bottom surface of the trench. Additionally, the method may include forming a source region at the bottom surface of the trench, the source region being adjacent to the second insulator layer, and separated from the drain region by the first and second insulator layers.

In various embodiments, the method may include one or more of the following features: forming a conductive member on the second insulator layer; forming a conductive member on the first and second insulator layers; forming the first insulator layer with a LOCOS process; forming the first insulator layer with a shallow trench isolation process; and removing the first hard mask and the portion of the first insulator layer, further including removing a first region at a higher rate than removing a second region, wherein the first region is adjacent to the hard mask and second region is spaced apart from the hard mask.

In accordance with some embodiments of this disclosure, a method of forming a semiconductor structure may include forming an insulator layer on a top surface of a semiconductor layer, the insulator layer extending below the top surface and being in contact with a trench in the top surface, the trench having a bottom surface and a sidewall, the bottom surface and the sidewall being in contact with the insulator layer. The method may also include forming a hard mask on the insulator layer; and forming an opening through the hard mask and the insulator layer, the opening extending to the bottom surface of the trench. Additionally, the method may include removing the hard mask and a portion of first insulator layer such that a remaining portion of the insulator layer is in contact with the bottom surface and the first sidewall, wherein a thickness of the remaining portion of the insulator layer is controlled by at least one of adjusting a width of the opening and a location of the opening.

BRIEF DESCRIPTION OF THE DRAWINGS

Reference will now be made, by way of example, to the accompanying drawings which show example embodiments of the present application, and in which:

FIGS. 1A and 1B show example semiconductor devices consistent with some embodiments of this disclosure;

FIGS. 2A and 2B show example semiconductor devices consistent with some embodiments of this disclosure;

FIGS. 3A and 3B show example semiconductor devices consistent with some embodiments of this disclosure;

FIGS. 4A-4H show example methods of manufacturing the device of FIG. 1A;

FIGS. 5A-5H show example methods of manufacturing the device of FIG. 1B;

FIGS. 6A-6F show example methods of manufacturing the device FIG. 2A;

FIGS. 7A-7F show example methods of manufacturing the device FIG. 2B;

FIGS. 8A-8D show example methods of manufacturing the device FIG. 3A;

FIGS. 9A-9D show example methods of manufacturing the device FIG. 3B; and

DESCRIPTION OF EXAMPLE EMBODIMENTS

Figure 4A:
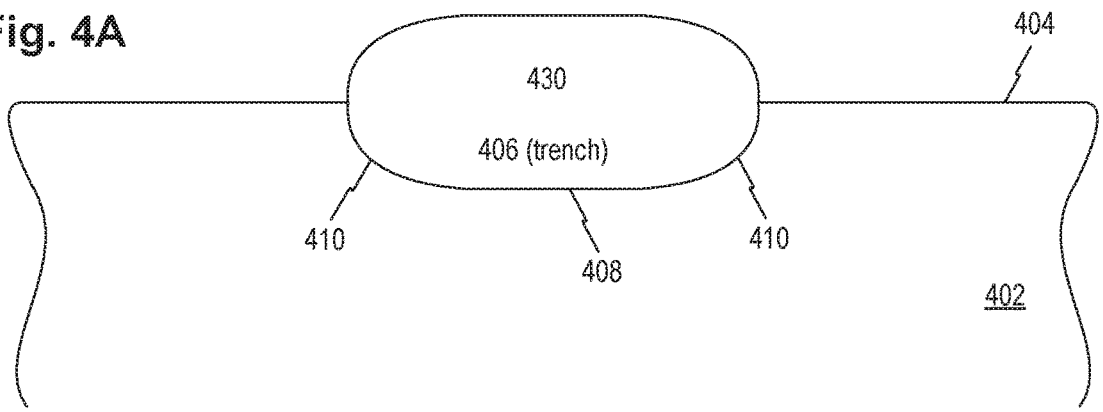

Reference will now be made in detail to the example embodiments, which are illustrated in the accompanying drawings.

Reference is now made to FIG. 1A, which shows an example semiconductor device 10A. Device 10A includes a semiconductor layer 102. A trench 106 is formed in a top surface 104 of semiconductor layer 102. Trench 106 has a bottom surface 108 and sidewalls 110. A drain region 120 is disposed at bottom surface 108 of trench 106. A source region 122 is disposed at top surface 104 of semiconductor layer 102 and is spaced apart from drain region 120. A first insulator 130 is disposed in trench 106, between drain region 120 and source region 122, and in contact with bottom surface 108 and sidewalls 110 of trench 106. A second insulator 132 is disposed between drain region 120 and source region 122, and on top surface 104 of semiconductor layer 102. In some embodiments, sidewalls 110 of trench 106 are curved. In some embodiments, device 10A includes a conductive member 140 disposed on second insulator 132. Conductive member 140 may, for example, function as a gate electrode to control or modulate conductivity of semiconductor layer 102 that is underneath second insulator layer 132. In some embodiments, conductive member 140 disposed on second insulator layer 132 extends onto first insulator layer 130. The portion of conductive member 140 disposed on insulator layer 130 may, for example, function as a field plate to reduce local electric field and increase breakdown voltage of device 10A.

In some embodiments, referring to FIG. 1B which represents a semiconductor device 10B that is similar to device 10A, an angle formed between sidewall 110 and bottom surface 108 of trench 106 is greater than 90 degrees.

When device 10A or 10B is activated by, for example, applying proper voltages at each terminal, a current conduction path 150 is formed in semiconductor layer 102 between source region 122 and drain region 120. Current conduction path 150 is disposed substantially along a perimeter of first insulator 130 such that current conduction path 150 includes a vertical component and a horizontal component. The vertical component of current path 150 provides an additional dimension for adjusting or improving parameters of a semiconductor device such as breakdown voltage or on-state resistance without substantially increasing device footprint. Thus, embodiments described here may achieve the same or better device performance with a reduced footprint as compared to a conventional device having a substantially horizontal current conduction path.

Reference is now made to FIG. 2A, which shows an example semiconductor device 20A. Device 20A includes a semiconductor layer 202. A trench 206 is formed in a top surface 204 of semiconductor layer 202. Trench 206 has a bottom surface 208 and sidewalls 210. A drain region 220 is disposed at bottom surface 208 of trench 206. A source region 222 is also disposed at bottom surface 208 of trench 206. A first insulator 230 is disposed in trench 206, between drain region 220 and source region 222, and on bottom surface 208 of trench 206. A second insulator 232 is disposed in trench 206, between source region 222 and first insulator 230, and on bottom surface 208 of trench 206. In some embodiments, sidewalls 210 of trench 206 are curved. In some embodiments, device 20A includes a conductive member 240 disposed on second insulator 232. Conductive member 240 may, for example, function as a gate electrode to control or modulate conductivity of semiconductor layer 202 that is underneath second insulator layer 232. In some embodiments, conductive member 240 disposed on second insulator layer 232 extends onto first insulator layer 230. The portion of conductive member 240 disposed on first insulator layer 230 may, for example, function as a field plate to reduce local electric field and increase breakdown voltage of device 20A.

In some embodiments, referring to FIG. 2B, which represents a semiconductor device 20B that is similar to device 20A, an angle formed between sidewall 210 and bottom surface 208 of trench 206 is greater than 90 degrees.

Reference is now made to FIG. 3A, which shows an example semiconductor device 30A. Device 30A includes a semiconductor layer 302. A trench 306 is formed in a top surface 304 of semiconductor layer 302. Trench 306 has a bottom surface 308 and sidewalls 310. A source region 322 is disposed at bottom surface 308 of trench 306. A drain region 320 is disposed at top surface 304 of semiconductor layer 302 and spaced apart from source region 322. A first insulator 330 is disposed in trench 306, between source region 322 and drain region 320, and in contact with bottom surface 308 and sidewall 310 of trench 306. A second insulator 332 is disposed between source region 322 and first insulator 330, and on bottom surface 308 of trench 306. In some embodiments, sidewalls 310 of trench 306 are curved. In some embodiments, device 30A includes a conductive member 340 disposed on second insulator 332. Conductive member 340 may, for example, function as a gate electrode to control or modulate conductivity of semiconductor layer 302 that is underneath second insulator layer 332. In some embodiments, conductive member 340 disposed on second insulator layer 332 extends onto first insulator layer 330. The portion of conductive member 340 disposed on first insulator layer 330 may, for example, function as a field plate to reduce local electric field and increase breakdown voltage of device 30A.

In some embodiments, referring to FIG. 3B, which represents a semiconductor device 30B that is similar to device 30A, an angle formed between sidewall 310 and bottom surface 308 of trench 306 is greater than 90 degrees.

When device 30A or 30B is activated by, for example, applying proper voltages at each terminal, a current conduction path 350 is formed in semiconductor layer 302 between source region 322 and drain region 320. Current conduction path 350 is disposed substantially along a perimeter of first insulator 330 such that current conduction path 350 includes a vertical component and a horizontal component. The vertical component of current path 350 provides an additional dimension for adjusting or improving parameters of a semiconductor device such as breakdown voltage or on-state resistance without substantially increasing device footprint. Thus, embodiments described here may achieve the same or better device performance with a reduced footprint as compared to a conventional device having a substantially horizontal current conduction path.

Next, example methods of manufacturing device 10A will be described with FIGS. 4A-4H. Referring to FIG. 4A, a first insulator layer 430 is formed on a top surface 404 of a semiconductor layer 402 such that first insulator layer 430 extends below top surface 404, and such that first insulator layer 430 is in contact with a trench 406 that is formed in top surface 404. Trench 406 includes a bottom surface 408 and sidewalls 410, where bottom surface 408 and sidewall 410 are in contact with first insulator layer 430. Semiconductor layer 402 may, for example, be a silicon layer, a silicon-containing layer, a silicon substrate or wafer, or a layer of elemental or compound semiconductor material. Insulator 430 and trench 406 may, for example, be formed concurrently by using a Local Oxidation of Silicon (LOCOS) process. The LOCOS process is known in the art of semiconductor fabrication and is not described further in detail in this disclosure.

Figure 4B:
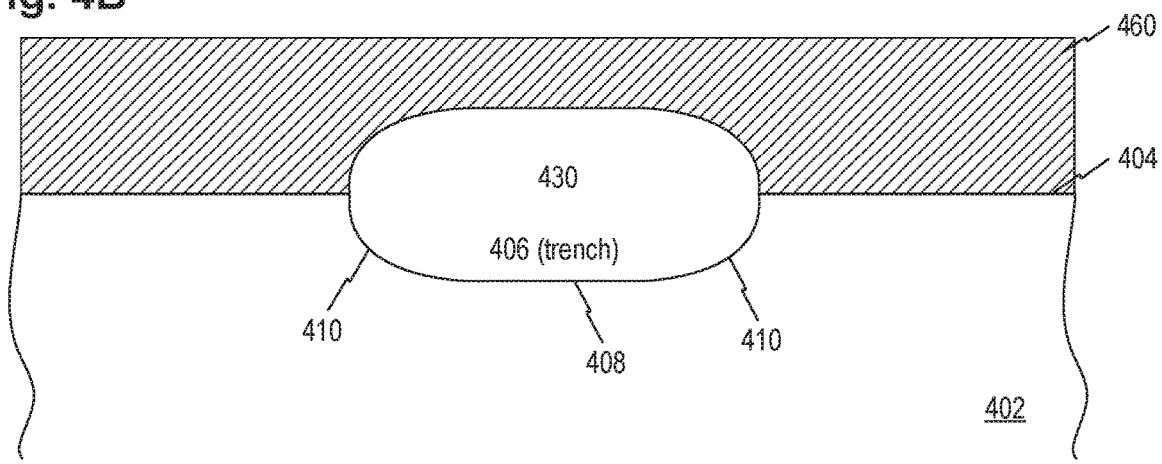

Referring to FIG. 4B, a hard mask 460 is formed on first insulator layer 430. Hard mask 460 may also cover top surface 404. In some embodiments, a buffer layer (not shown) may be formed between hard mask 460 and first insulator layer 430, or between hard mask 460 and top surface 404 to reduce any strain caused by hard mask 460. Hard mask 460 may, for example, be silicon nitride, silicon oxynitride, a silicon nitride containing material, a metal, or other suitable material. Formation of hard mask 460 may be performed using, for example, a low-pressure (LP) chemical vapor deposition (CVD) process, a plasma-enhanced (PE) CVD process, or other suitable CVD processes. Formation of hard mask 460 may also be performed using, for example, a physical vapor deposition (PVD) process, such as sputtering, evaporation, or other suitable PVD processes.

Figure 4C:
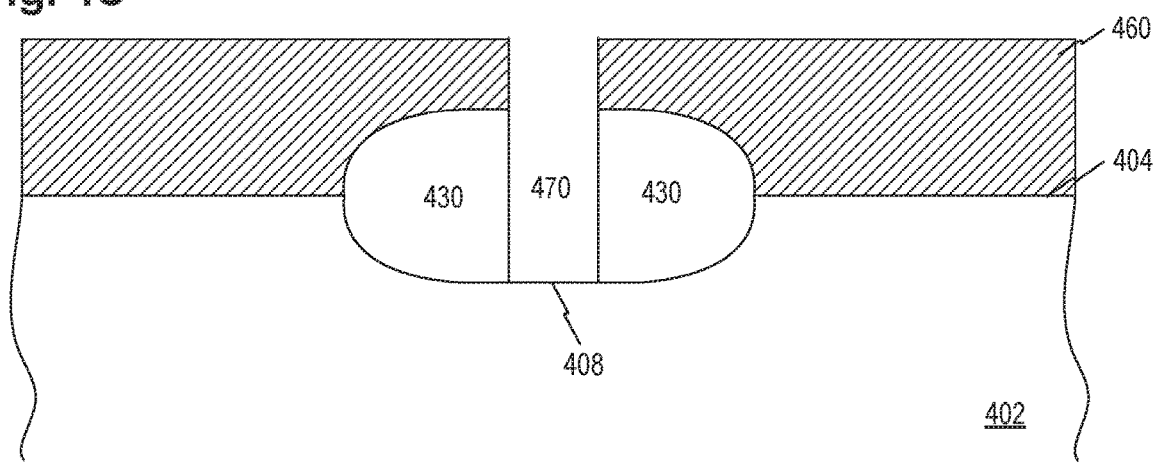
Figure 4G:
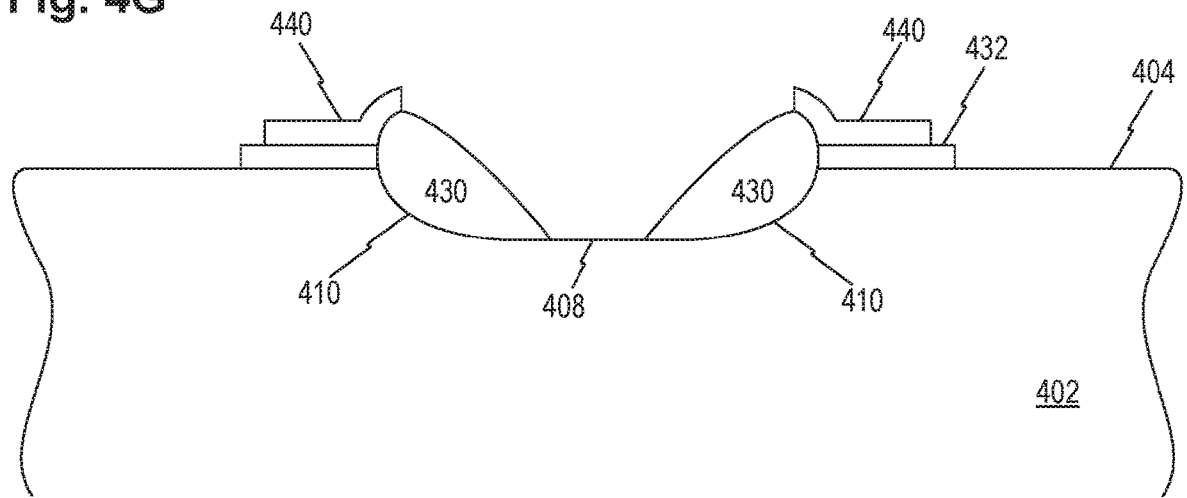

Referring to FIG. 4C, an opening 470 is formed through hard mask 460 and first insulator layer 430. Opening 470 extends to bottom surface 408 of trench 406. Formation of opening 470 may be performed using, for example, a combination of a lithography process and an etch process. By using a lithography process, a resist layer that is disposed on hard mask 460 may be patterned to form an opening having an area that substantially corresponds to the cross sectional area of opening 470. Then, by using an etch process, a portion of hard mask 460 and a portion of first insulator layer 430 may be removed through the patterned opening of the resist layer. By controlling parameters of the etch process, such as time, temperature, or etch chemistry, depth and sidewall profiles of opening 470 can be controlled and modified.

Referring to FIG. 4D, hard mask 460 and a portion of first insulator layer 430 are removed such that a remaining portion of first insulator layer 430 remains in contact with bottom surface 408 and sidewalls 410 of trench 406. The process of removing hard mask 460 and the portion of first insulator layer 430 may be performed using, for example, a wet etch process, a dry etch process, a combined process of a wet and dry processes, or other processes that effectively remove hard mask 460 without completely removing first insulator layer 430. In some embodiments, the portion of first insulator layer 430 being removed includes a first region adjacent to hard mask 460 and a second region spaced apart from hard mask 460. During a removal process of hard mask 460 and the portion of first insulator layer 430, the first region (adjacent to hard mask 460) is removed at a higher rate than the second region (spaced apart from hard mask 460). The enhanced removal rate of the first region may, for example, be a result of a strain applied to the first region. The strain may, for example, be caused by an internal stress of hard mask 460.

In some embodiments, the strain can be adjusted by, for example, adjusting a formation process of hard mask 460. For example, if hard mask 460 is a silicon nitride layer, hard mask 460 may be formed by a PE-CVD process. By using a PE-CVD process, an internal stress of silicon nitride layer may, for example, be controlled by adjusting partial pressures of source gases (such as $NH_3$, $SiH_4$, and $H_2$) during the hard mask formation process (such as, for example, depositing hard mask 460 on first insulator 430) so as to control the strain applied to first insulator layer 430. In some embodiments, removal rates for hard mask 460 and first insulator 430 may be adjusted by controlling density, stoichiometry, or quality of hard mask 460 and first insulator 430 during their formation processes. By adjusting the removal rates of hard mask 460 and first insulator 430, the thickness or shape of the remaining portion of first insulator layer 430 may be controlled.

Referring to FIG. 4E, a second insulator layer 432 is formed on top surface 404 of semiconductor layer 402. Second insulator layer 432 is adjacent to first insulator layer 430. Second insulator layer 432 may be formed by, for example, oxidizing top surface 404 of semiconductor layer 402, or by depositing an insulator material by using a CVD process, a atomic layer deposition (ALD) process, a molecular beam epitaxy (MBE) process, a PVD process, or other suitable deposition processes. Second insulator layer 432 may, for example, be patterned by a combination of lithography and etch processes.

Referring to FIG. 4F, a conductive member 440 is formed on second insulator layer 432. In some embodiments, referring to FIG. 4G, conductive member 440 is formed on first insulator layer 430 and second insulator layer 432. Conductive member 440 may be formed by, for example, depositing an semiconductor material or a conductive material using CVD, ALD, MBE, PVD, or other suitable techniques. Conductive member 440 may, for example, be patterned by a combination of lithography and etch processes.

Figure 4H:
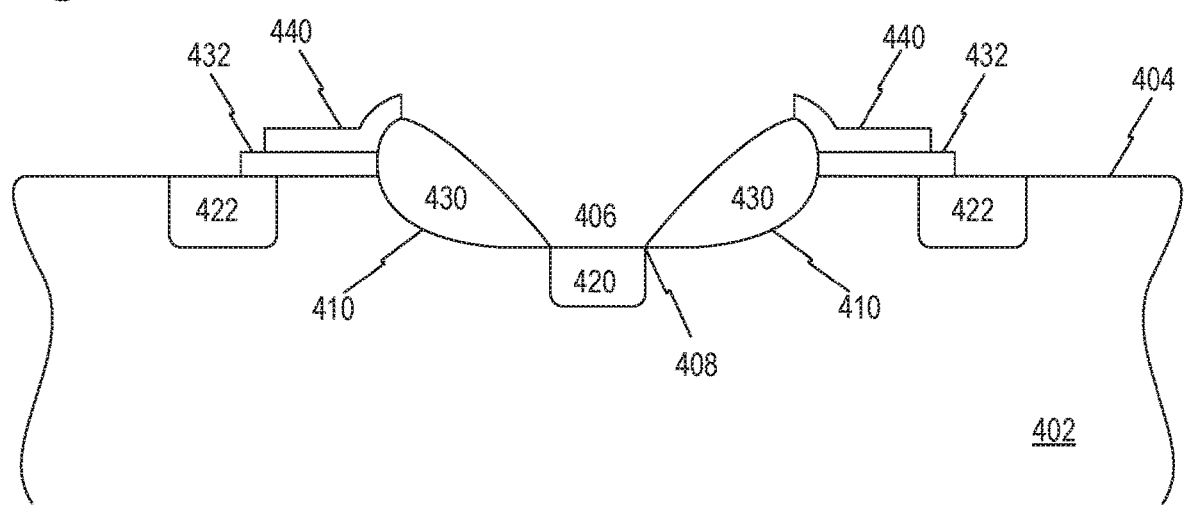

Referring to FIG. 4H, a drain region 420 is formed at bottom surface 408 of trench 406. A source region 422 is formed at top surface 404 of semiconductor layer 402. Source region 422 is disposed adjacent to second insulator layer 432, and separated from drain region 420 by first insulator layer 430 and second insulator layer 432. Source region 422 or drain region 420 may be formed by, for example, a combination of a lithography process and a doping process. For example, an area of source region 422 or drain region 420 may be defined or patterned by using a lithography process. The lithography-defined area of source region 422 or drain region 420 may be doped to achieve a certain doping type or concentration by, for example, using an implantation process. In some embodiments, the implantation process for drain region 420 or source region 422 may include implanting dopants into conductive member 440 for modifying conductivity of conductive member 440.

Figure 5A:
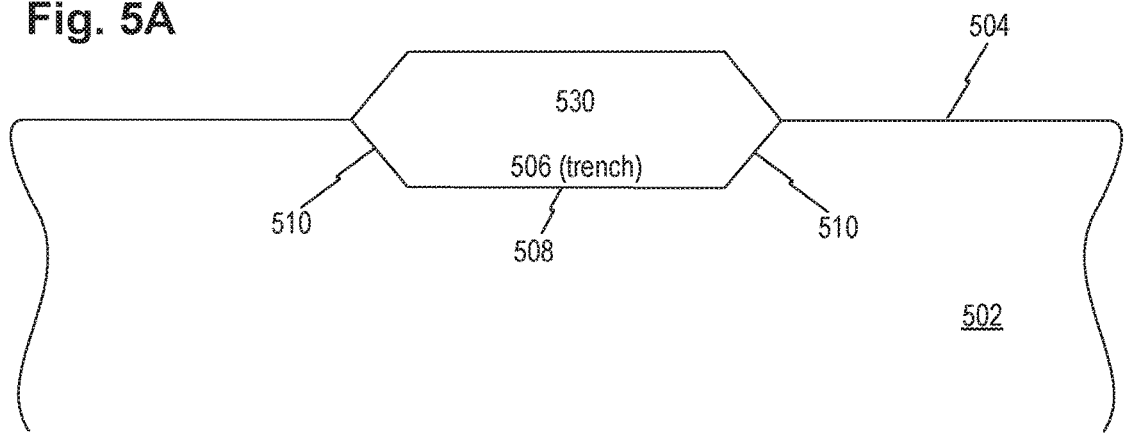
Figure 5B:
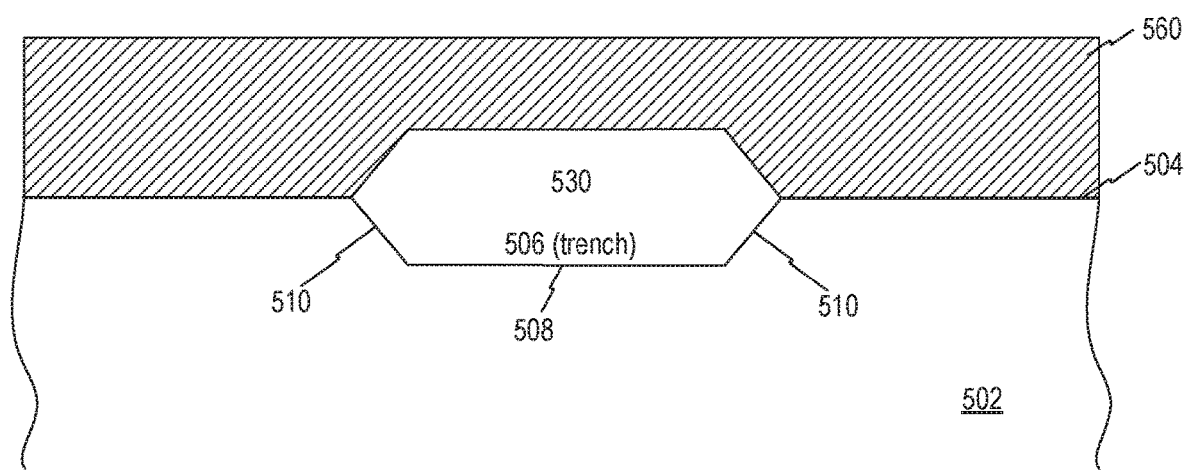
Figure 5C:
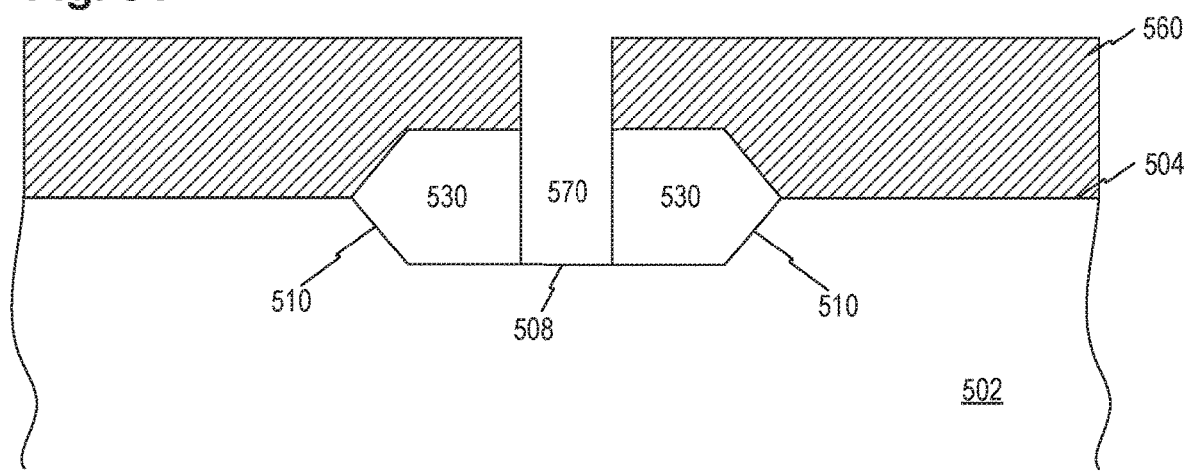
Figure 5D:
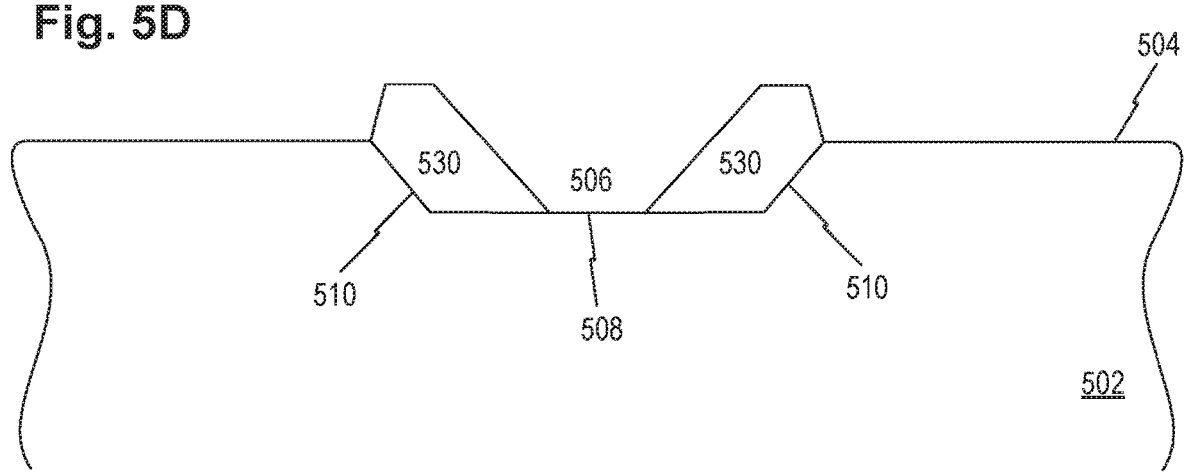
Figure 5E:
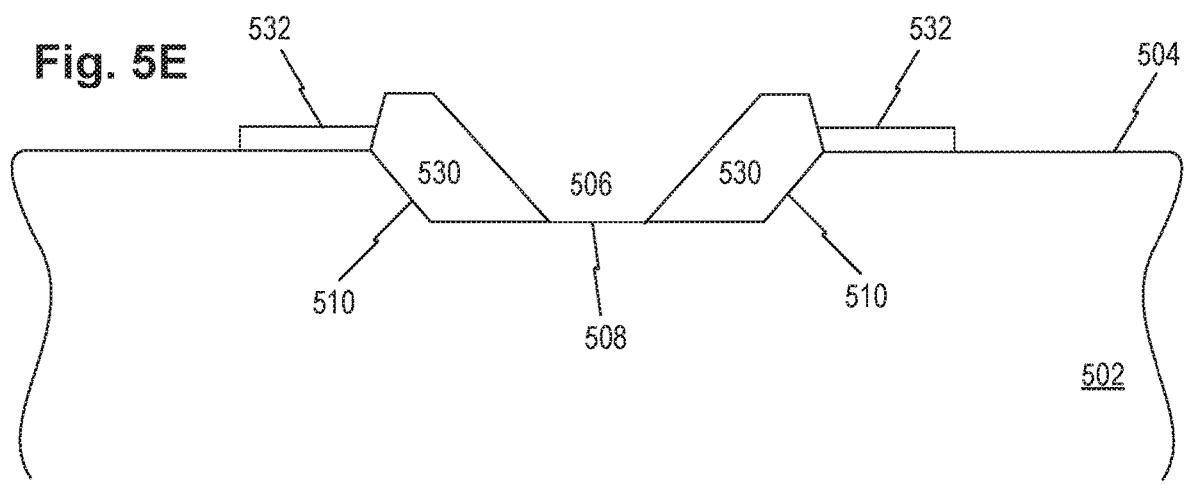
Figure 5F:
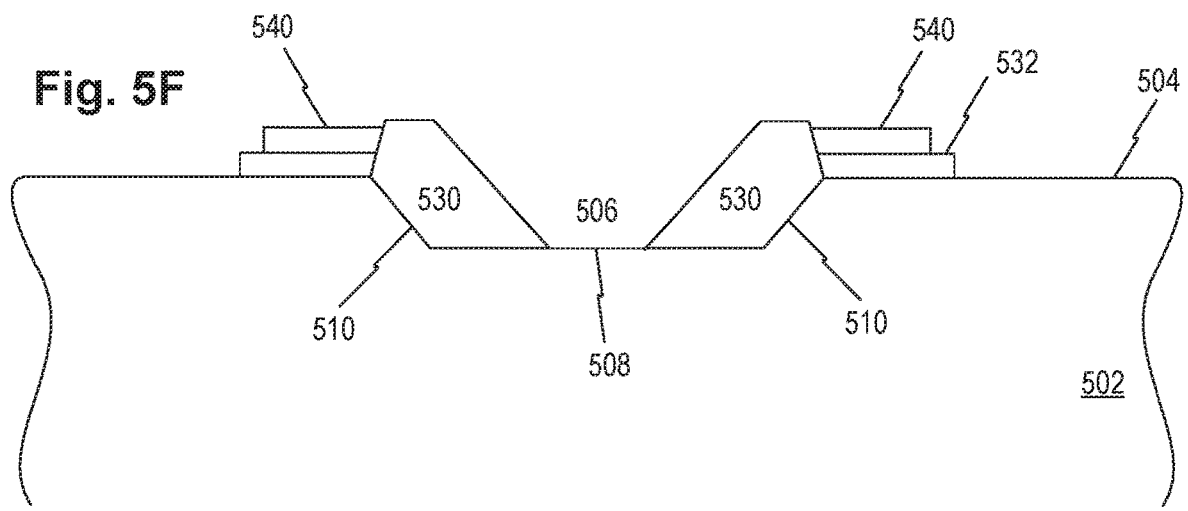

Referring to FIG. 5A, in some embodiments, first insulator 530 is formed with a shallow trench isolation process. Process steps, as illustrated in FIGS. 5A-5H, which are similar to those described in the context of FIGS. 4A-4H, may be conducted to manufacture device 10B.

Figure 6A:
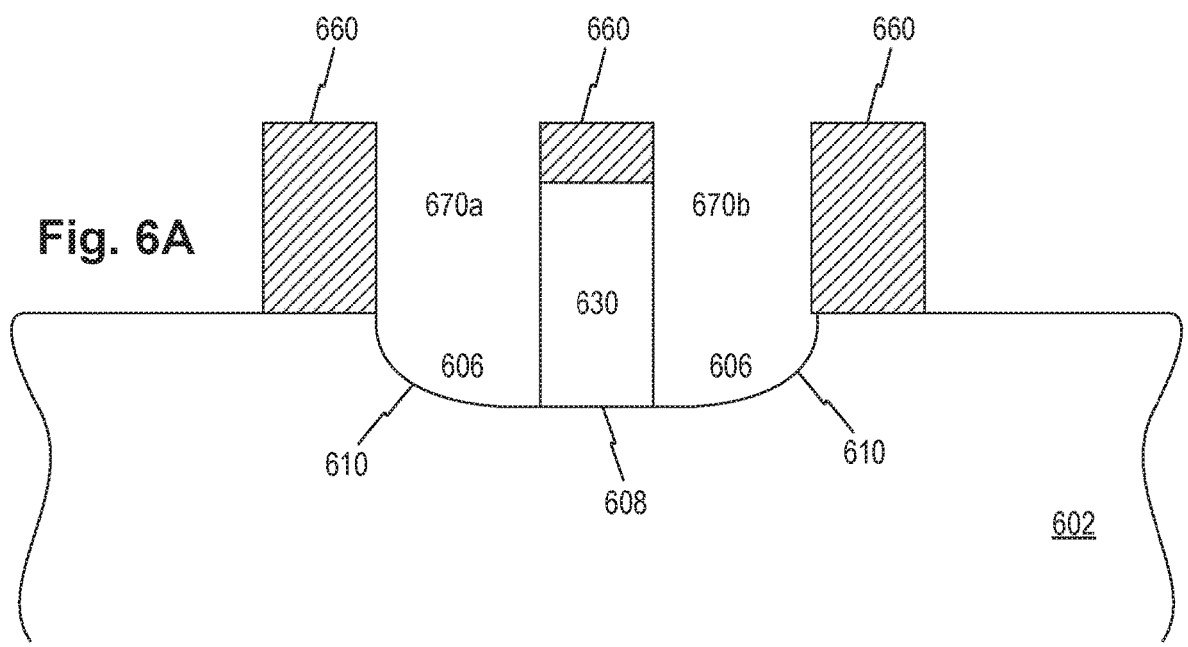

Next, example methods of manufacturing device 20A will be described with corresponding figures. Starting from the structure illustrated in FIG. 4B, instead of forming a single opening as shown in FIG. 4C, two or more openings may be formed. As illustrated in FIG. 6A, a first opening 670a and a second opening 670b are formed through a hard mask 660 and a first insulator layer 630. First opening 670a and second opening 670b extend to a bottom surface 608 and sidewalls 610 of a trench 606. Formation process of first opening 670a and second opening 670b may be, for example, a combination of a lithography process and an etch process. By using a lithography process, a resist layer that is disposed on hard mask 660 may be patterned to form openings having areas that substantially correspond to the cross sectional areas of first opening 670a and second opening 670b. Then, by using an etch process, a portion of hard mask 660 and a portion of first insulator layer 630 may be removed through the patterned openings of the resist layer. By controlling parameters of the etch process, such as time, temperature, or etch chemistry, depth and sidewall profiles of first opening 670a and second opening 670b can be controlled and modified.

Figure 6B:
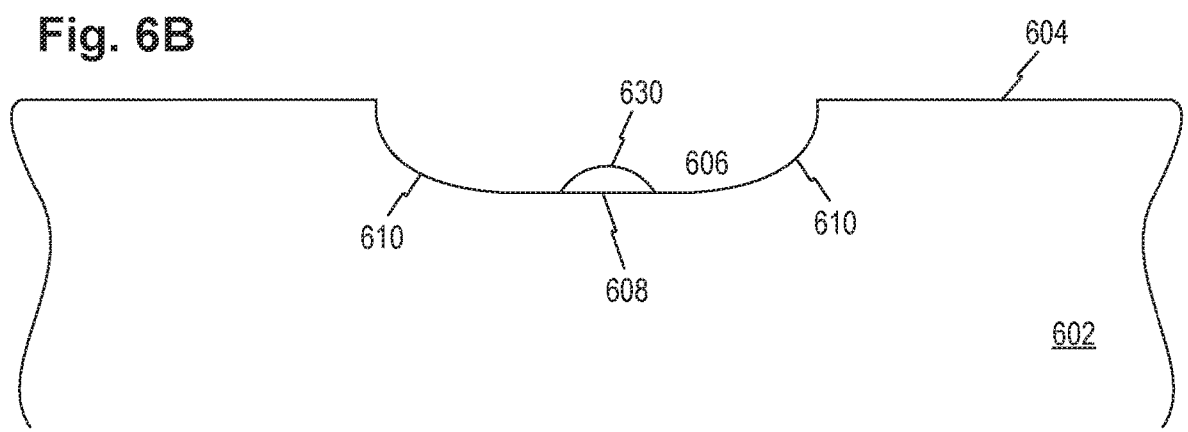

Referring to FIG. 6B, hard mask 660 and a portion of first insulator layer 630 are removed such that a remaining portion of first insulator layer 630 is in contact with bottom surface 608 of trench 606. The process of removing hard mask 660 and the portion of first insulator layer 630 may be, for example, a wet etch process, a dry etch process, a combined process of a wet and dry processes, or other processes that effectively remove hard mask 660 without completely removing first insulator layer 630. In some embodiments, the portion of first insulator layer 630 being removed includes a first region adjacent to hard mask 660 and a second region spaced apart from hard mask 660. During a removal process of hard mask 660 and the portion of first insulator layer 630, the first region (adjacent to hard mask 660) is removed at a higher rate than the second region (spaced apart from hard mask 660). The enhanced removal rate of the first region may, for example, be a result of a strain applied to the first region. The strain may, for example, be caused by an internal stress of hard mask 660.

In some embodiments, the strain can be adjusted by, for example, adjusting a formation process of hard mask 660. For example, if hard mask 660 is a silicon nitride layer, hard mask 660 may be formed by a PE-CVD process. By using a PE-CVD process, an internal stress of a silicon nitride layer may, for example, be controlled by adjusting partial pressures of source gases (such as $NH_3$, $SiH_4$, and $H_2$) during hard mask formation process (such as, for example, depositing hard mask 460 on first insulator 430) so as to control the strain applied to first insulator layer 630. In some embodiments, removal rates for hard mask 460 and first insulator 430 may be adjusted by controlling density, stoichiometry, or quality of hard mask 460 and first insulator 430 during their formation processes. By adjusting the removal rates of hard mask 460 and first insulator 430, the thickness or shape of the remaining portion of first insulator layer 430 may be controlled.

Figure 6C:
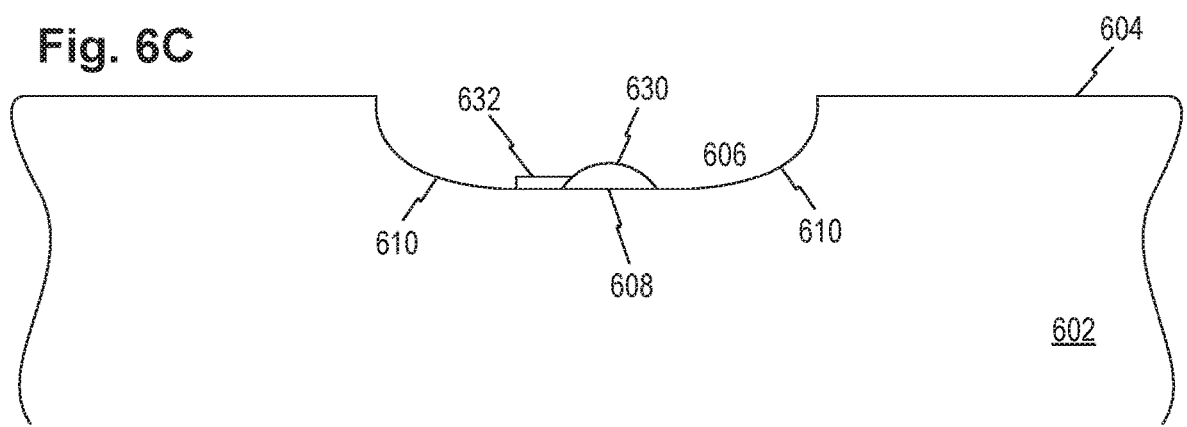

Referring to FIG. 6C, a second insulator layer 632 is formed on bottom surface 608 of trench 606. Second insulator layer 632 may, for example, be formed by oxidizing bottom surface 608 of trench 606, or by depositing an insulator material by using a CVD process, an ALD) process, a MBE process, a PVD process, or other suitable deposition processes. Second insulator layer 632 may, for example, be patterned by a combination of lithography and etch processes.

Referring to FIG. 6D, a conductive member 640 is formed on second insulator layer 632. In some embodiments, referring to FIG. 6E, conductive member 640 is formed on first insulator layer 630 and second insulator layer 632. Conductive member 440 may, for example, be formed by depositing an semiconductor material or a conductive material using CVD, ALD, MBE, PVD, or other suitable techniques. Conductive member 640 may, for example, be patterned by a combination of lithography and etch processes.

Referring to FIG. 6F, a drain region 620 is formed at bottom surface 608 of trench 606. A source region 622 is also formed at bottom surface 608 of trench 606. Source region is adjacent to second insulator layer 632, and separated from drain region 620 by first insulator layer 630 and second insulator layer 632. Source region 622 or drain region 620 may, for example, be formed by a combination of an lithography process and a doping process. For example, an area of source region 622 or drain region 620 may be defined or patterned by using a lithography process. The lithography-defined area of source region 622 or drain region 620 may be doped to achieve a certain doping type or concentration by, for example, using an implantation process. In some embodiments, the implantation process for drain region 620 or source region 622 may include implanting dopants into conductive member 640 for modifying conductivity of conductive member 640.

Figure 7A:
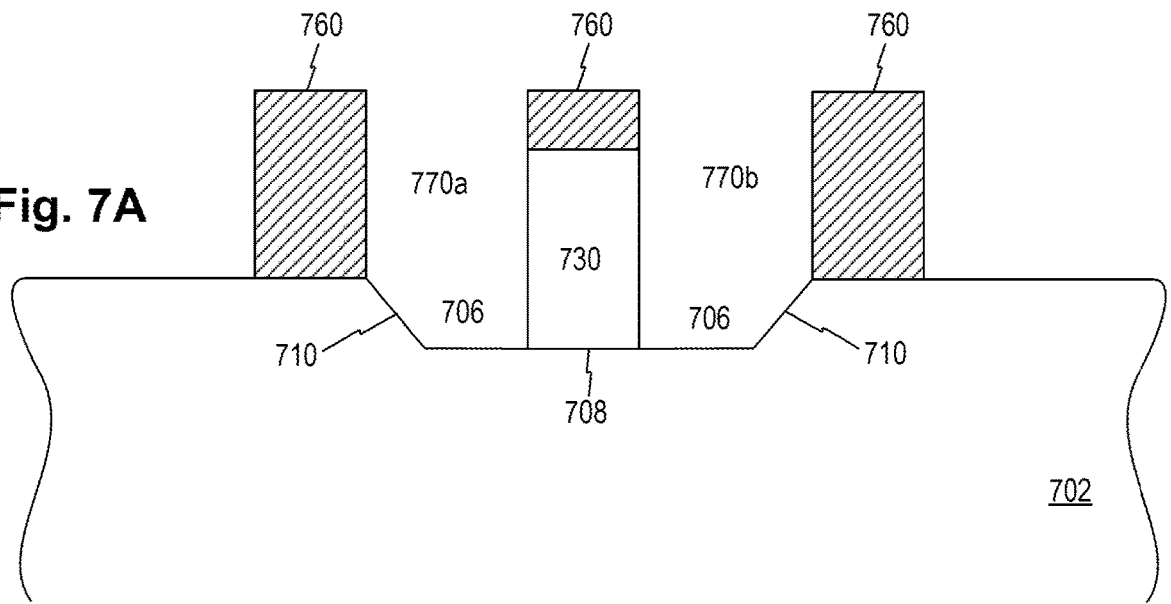
Figure 7B:
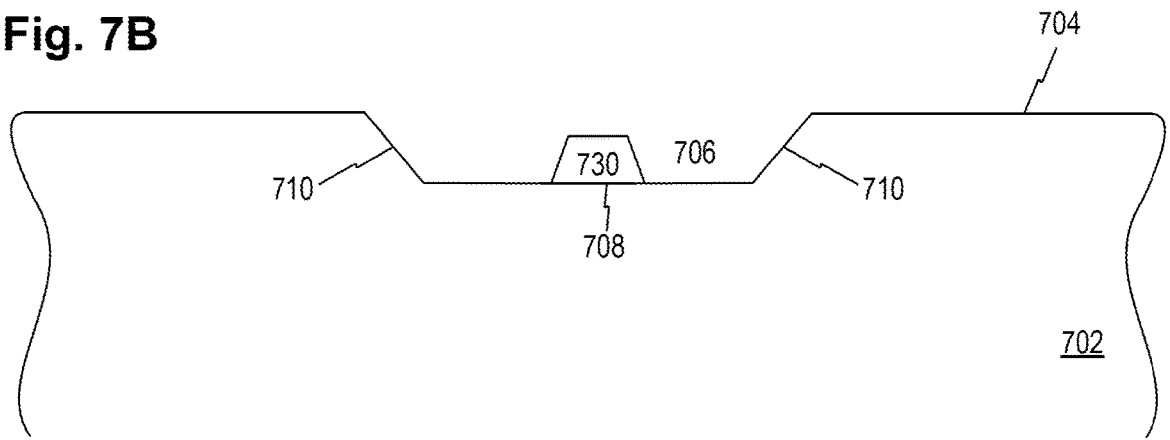
Figure 7C:
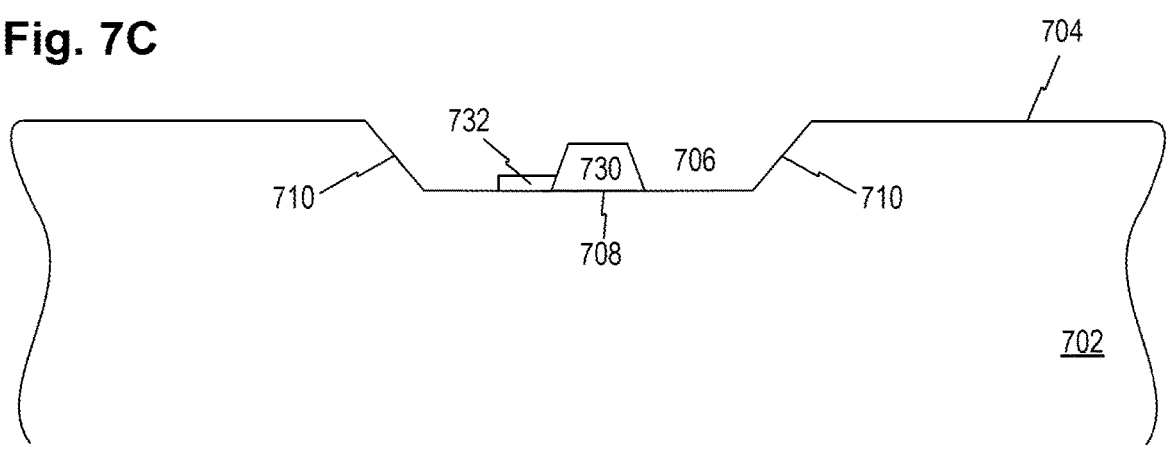

Referring to FIG. 7A, in some embodiments, first insulator 730 is formed with a shallow trench isolation process. Process steps, as illustrated in FIGS. 7A-7F, which are similar to those described in the context of FIGS. 6A-6F, may be conducted to manufacture device 20B.

Next, example methods of manufacturing device 30A will be described with corresponding figures. Referring to FIG. 8A, based on the structure illustrated in FIG. 4D, a second insulator layer 832 is formed on a bottom surface 808 of a trench 806. Second insulator layer 832 is adjacent to a first insulator layer 830.

Referring to FIG. 8B, a conductive member 840 is formed on second insulator layer 832. In some embodiments, referring to FIG. 8C, conductive member 840 is formed on first insulator layer 830 and second insulator layer 832. Conductive member 840 may, for example, be formed by depositing an semiconductor material or a conductive material using CVD, ALD, MBE, PVD, or other suitable techniques. Conductive member 640 may, for example, be patterned by a combination of lithography and etch processes.

Referring to FIG. 8D, a drain region 820 is formed at a top surface 804 of a semiconductor layer 802. A source region 822 is formed at bottom surface 808 of trench 806. Source region 822 is adjacent to second insulator layer 832, and is separated from drain region 820 by first insulator layer 830 and second insulator layers 832. Source region 822 or drain region 820 may, for example, be formed by a combination of a lithography process and a doping process. For example, an area of source region 822 or drain region 820 may be defined or patterned by using a lithography process. The lithography-defined area of source region 822 or drain region 820 may be doped to achieve a certain doping type or concentration by using, for example, an implantation process. In some embodiments, the implantation process for drain region 820 or source region 822 may include implanting dopants into conductive member 840 for modifying the conductivity of conductive member 840.

Referring to FIG. 9A, in some embodiments, first insulator 930 is formed with a shallow trench isolation process. Process steps, as illustrated in FIGS. 9A-9D, which are similar to those described in the context of FIGS. 8A-8D, may be conducted to manufacture device 30B.

Figure 10A:
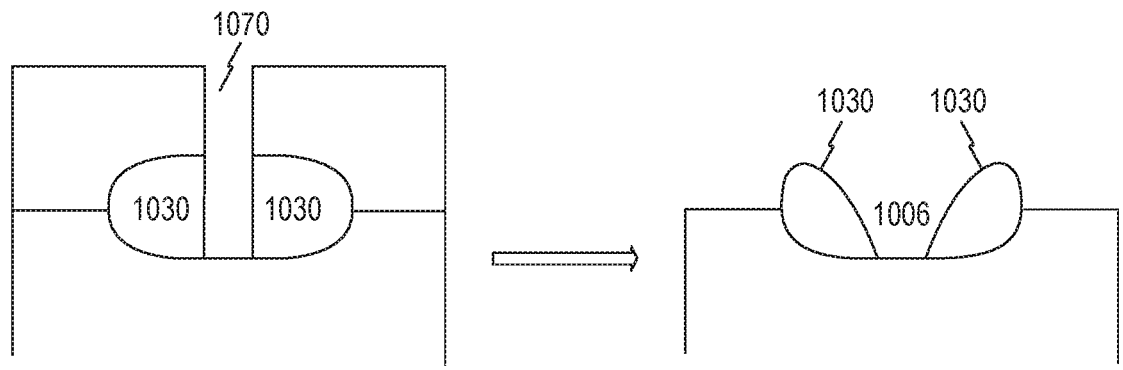
FIGS. 10A-10C show example methods of manufacturing semiconductor devices consistent with some embodiments of this disclosure.
Figure 10B:
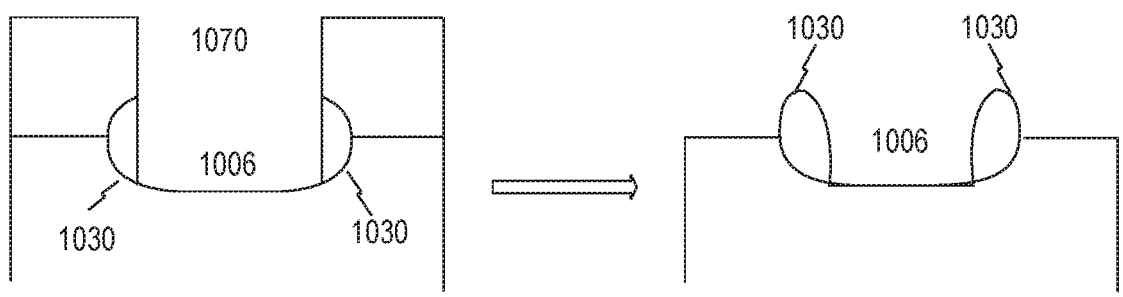
Figure 10C:
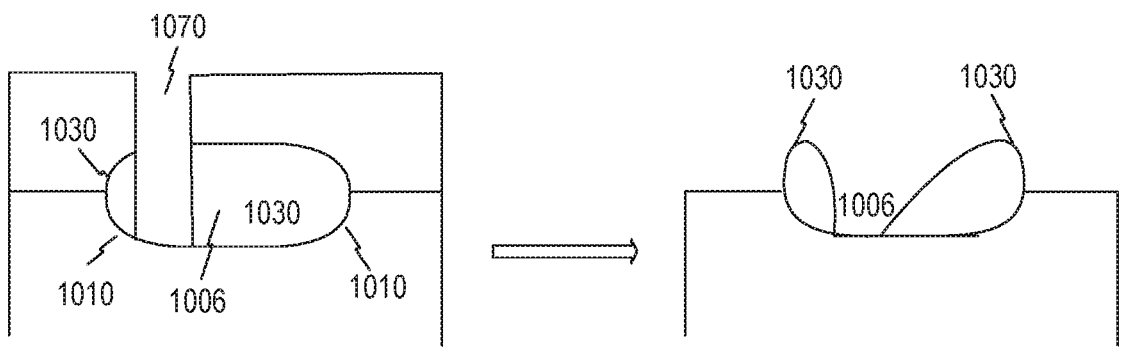

Referring to FIGS. 10A and 10B, in some embodiments, thickness of a first insulator 1030 may be adjusted, for example, by controlling width of an opening 1070, or by controlling width of a trench 1006. In some embodiments, referring to FIG. 10C, opening 1070 may be formed near a sidewall 1010 of a trench 1006 to adjust thickness of first insulator 1030.

In some embodiments, various combinations of devices selected from a group of devices 10A, 20A, and 30A may be formed on the same semiconductor layer. In some embodiments, the combination of devices may be fabricated concurrently by sharing some or all process steps and by using the same materials for the concurrent step(s). For example, first insulators of devices 10A and 20A may be fabricated on the same semiconductor layer concurrently and by using the insulator material.

In some embodiments, various combinations of devices selected from devices 10B, 20B, and 30B may be formed on the same semiconductor surface. In some embodiments, the combination of devices may be fabricated concurrently by sharing some or all process steps and by using the same materials for the concurrent step(s). For example, first insulators of devices 10B and 20B may be fabricated on the same semiconductor layer concurrently and using the same insulator material.

In some embodiments, devices 10A, 10B, 20A, 20B, 30A, or 30B, may be, for example, a field effect transistor (FET) with a conductive member functioning as a gate electrode of the FET. The conductive member may also function as a field plate to reduce the local electric field and increase breakdown voltage of the FET. Source and drain regions may be formed using the aforementioned methods. Additional doped regions may be formed, for example, by implantation, to control a conductivity value and conductivity type of the FET. For example, source and drain regions may be doped with n-type dopants, and a region under a second insulator may be doped with p-type dopants to form a n-channel FET. Additionally or alternatively, a region of a trench (which is also a region of semiconductor layer) in contact with a first insulator may be doped with n-type dopants to function as a drain extension of the FET to, for example, increase an operation voltage of the FET or increase the FET's source-to-drain breakdown voltage. By using dopants of opposite doping types described in the above example, a p-channel FET with a drain extension may be formed.

In some embodiments, devices 10A, 10B, 20A, 20B, 30A, or 30B, may be, for example, a diode, wherein source and drain regions are doped with dopants of opposite doping types to form a p-n or a p-i-n diode. Additionally or alternatively, a region of a trench in contact with a first insulator may be doped to control a conductivity value or breakdown voltage of the diode.

Certain adaptations and modifications of the described embodiments can be made. Therefore, the above discussed embodiments are considered to be illustrative and not restrictive.

What is claimed is:

1. A method of forming a semiconductor structure, the method comprising:

forming a first insulator layer on a first top surface of a semiconductor layer, the first insulator layer extending below the first top surface and being in contact with a first trench in the first top surface, the first trench having:
a first bottom surface, and
a first sidewall, the first bottom surface and the first sidewall being in contact with the first insulator layer;
forming a first hard mask on the first insulator layer;
forming a first opening through the first hard mask and the first insulator layer, the first opening extending to the first bottom surface of the first trench;
removing the first hard mask and a portion of the first insulator layer such that a remaining portion of the first insulator layer is in contact with the first bottom surface and the first sidewall;
forming a second insulator layer on the first top surface of the semiconductor layer, the second insulator layer being adjacent to the first insulator layer;
forming a first drain region at the first bottom surface of the first trench; and
forming a first source region at the first top surface of the semiconductor layer, the first source region being adjacent to the second insulator layer, and separated from the first drain region by the first and second insulator layers.

2. The method according to claim 1, further comprising:
forming a first conductive member on the second insulator layer.

3. The method according to claim 1, further comprising:
forming a first conductive member on the first and second insulator layers.

4. The method according to claim 1, wherein forming the first insulator layer comprises forming the first insulator layer with a LOCOS process or a shallow trench isolation process.

5. The method according to claim 1;
wherein the portion of the first insulator layer being removed includes:
a first region adjacent to the hard mask and
a second region spaced apart from the hard mask; and
wherein removing the first hard mask and the portion of the first insulator layer further comprises removing the first region at a higher rate than removing the second region.

6. The method according to claim 1, further comprising:
forming a third insulator layer on a second top surface of the semiconductor layer, the third insulator layer extending below the second top surface and being in contact with a second trench in the second top surface, the second trench having:
a second bottom surface, and
a second sidewall;
forming a second hard mask on the third insulator layer;
forming a second opening and a third opening through the second hard mask and the third insulator layer, the second and third openings extending to the second bottom surface and the second sidewall of the second trench;
removing the second hard mask and a portion of the third insulator layer such that a remaining portion of the third insulator layer is in contact with the second bottom surface of the second trench;
forming a fourth insulator layer on the second bottom surface of the second trench, the fourth insulator layer being adjacent to the third insulator layer;
forming a second drain region at the second bottom surface of the second trench; and
forming a second source region at the second bottom surface of the second trench, the second source region being adjacent to the fourth insulator layer, and laterally separated from the second drain region by the third and fourth insulator layers.

7. The method according to claim 6, further comprising:
forming a second conductive member on the fourth insulator layer.

8. The method according to claim 6, further comprising:
forming a second conductive member on the third and fourth insulator layers.

9. The method according to claim 6, wherein:
the first insulator layer and the third insulator layer are formed in a single process step.

10. The method according to claim 6, wherein forming the third insulator layer comprises forming the third insulator layer with a LOCOS process or a shallow trench isolation process.

11. The method according to claim 1, further comprising:
forming a third insulator layer on a second top surface of the semiconductor layer, the third insulator layer extending below the second top surface and being in contact with a second trench in the second top surface, the second trench having:
a second bottom surface, and
a second sidewall;
forming a second hard mask on the third insulator layer;
forming a second opening through the second hard mask and the third insulator layer, the second opening extending to the second bottom surface of the second trench;
removing the second hard mask and a portion of the third insulator layer such that a remaining portion of the third insulator layer is in contact with the second bottom surface and the second sidewall;
forming a fourth insulator layer on the second bottom surface of the second trench, the fourth insulator layer being adjacent to the third insulator layer;
forming a second drain region at the second top surface of the semiconductor layer; and
forming a second source region at the second bottom surface of the second trench, the second source region being adjacent to the fourth insulator layer, and separated from the second drain region by the third and fourth insulator layers.

12. The method according to claim 11, further comprising:
forming a second conductive member on the fourth insulator layer.

13. The method according to claim 11, further comprising:
forming a second conductive member on the third and fourth insulator layers.

14. The method according to claim 11, wherein:
the first insulator layer and the third insulator layer are formed in a single process step.

15. The method according to claim 11, wherein forming the third insulator layer comprises forming the third insulator layer with a LOCOS process or a shallow trench isolation process.

* * * * *